(12) United States Patent
Okazaki et al.

(10) Patent No.: US 9,054,200 B2
(45) Date of Patent: Jun. 9, 2015

(54) SEMICONDUCTOR DEVICE

(71) Applicant: Semiconductor Energy Laboratory Co., Ltd., Atsugi-shi, Kanagawa-ken (JP)

(72) Inventors: Kenichi Okazaki, Tochigi (JP);
Toshiyuki Miyamoto, Kanuma (JP);
Masafumi Nomura, Tochigi (JP);
Takashi Hamochi, Shimotsuga (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 56 days.

(21) Appl. No.: 13/856,452

(22) Filed: Apr. 4, 2013

(65) Prior Publication Data
US 2013/0270550 A1    Oct. 17, 2013

(30) Foreign Application Priority Data

Apr. 13, 2012    (JP) ................................. 2012-092323
Mar. 14, 2013    (JP) ................................. 2013-051819

(51) Int. Cl.
*H01L 29/786*    (2006.01)
*H01L 29/66*    (2006.01)
*H01L 27/12*    (2006.01)

(52) U.S. Cl.
CPC ...... *H01L 29/7869* (2013.01); *H01L 29/66742* (2013.01); *H01L 27/1248* (2013.01); *H01L 27/1225* (2013.01)

(58) Field of Classification Search
CPC ..................... H01L 21/0217; H01L 21/02252; H01L 21/3144; H01L 21/3185; H01L 27/105; H01L 29/518; H01L 29/4908; H01L 21/02164; H01L 21/02216; H01L 21/76834; H01L 21/02214; H01L 21/02282; H01L 21/0214; H01L 21/28; H01L 21/822; H01L 21/8236; H01L 21/8238; H01L 21/02565; H01L 21/02554; H01L 21/02631; H01L 21/02488; H01L 21/02422; H01L 21/02472; H01L 21/0262; H01L 21/02109; H01L 27/04; H01L 27/08; H01L 27/088; H01L 27/092; H01L 27/1225; H01L 27/1255; H01L 27/1259; H01L 27/127; H01L 27/0629; H01L 27/0733; H01L 27/11807; H01L 27/124; H01L 27/1248; H01L 27/14678; H01L 27/14692; H01L 29/786; H01L 29/423; H01L 29/49; H01L 29/7869; H01L 29/66969; H01L 29/78696; H01L 29/78693; H01L 29/24; H01L 29/66742; H01L 2924/0002; H01L 29/247; H01L 29/513; H01L 2924/00; H01L 29/22
USPC ................... 257/E21.279, E29.151, E21.261, 257/E21.576, E21.268, E21.285, E21.293, 257/E21.689, E27.081, E21.682, E27.103, 257/E21.241, E21.26, E21.269, E29.129, 257/E29.295, E21.219, E21.347, E21.413, 257/E21.625, E21.645, E21.679, E27.111, 257/E29.275, 140, 146, 314, 411, 510, 257/E21.422, E21.621, E21.635, E29.255, 257/E29.3, E33.013, 103, 316, 410, 499, 257/506, 632, E21.09, E21.134, E21.158, 257/E21.24, E21.267, E21.278, E21.304, 257/E21.561, E21.567, E21.574, E21.619, 257/E21.639, E27.009, E27.011
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |
| 5,744,864 A | 4/1998 | Cillessen et al. |
| 5,834,827 A | 11/1998 | Miyasaka et al. |
| 5,858,819 A | 1/1999 | Miyasaka |
| 6,017,779 A | 1/2000 | Miyasaka |
| 6,146,928 A * | 11/2000 | Ishiguro et al. ............... 438/151 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |

| | | | | | | |
|---|---|---|---|---|---|---|
| 7,049,190 B2 | 5/2006 | Takeda et al. | | 2008/0224133 A1 | 9/2008 | Park et al. |
| 7,061,014 B2 | 6/2006 | Hosono et al. | | 2008/0254569 A1 | 10/2008 | Hoffman et al. |
| 7,064,346 B2 | 6/2006 | Kawasaki et al. | | 2008/0258139 A1 | 10/2008 | Ito et al. |
| 7,105,868 B2 | 9/2006 | Nause et al. | | 2008/0258140 A1 | 10/2008 | Lee et al. |
| 7,211,825 B2 | 5/2007 | Shih et al | | 2008/0258141 A1 | 10/2008 | Park et al. |
| 7,282,782 B2 | 10/2007 | Hoffman et al. | | 2008/0258143 A1 | 10/2008 | Kim et al. |
| 7,297,977 B2 | 11/2007 | Hoffman et al. | | 2008/0296568 A1 | 12/2008 | Ryu et al. |
| 7,323,356 B2 | 1/2008 | Hosono et al. | | 2009/0068773 A1 | 3/2009 | Lai et al. |
| 7,385,224 B2 | 6/2008 | Ishii et al. | | 2009/0073325 A1 | 3/2009 | Kuwabara et al. |
| 7,402,506 B2 | 7/2008 | Levy et al. | | 2009/0114910 A1 | 5/2009 | Chang |
| 7,411,209 B2 | 8/2008 | Endo et al. | | 2009/0134399 A1 | 5/2009 | Sakakura et al. |
| 7,453,065 B2 | 11/2008 | Saito et al. | | 2009/0152506 A1 | 6/2009 | Umeda et al. |
| 7,453,087 B2 | 11/2008 | Iwasaki | | 2009/0152541 A1 | 6/2009 | Maekawa et al. |
| 7,462,862 B2 | 12/2008 | Hoffman et al. | | 2009/0278122 A1 | 11/2009 | Hosono et al. |
| 7,468,304 B2 | 12/2008 | Kaji et al. | | 2009/0280600 A1 | 11/2009 | Hosono et al. |
| 7,501,293 B2 | 3/2009 | Ito et al. | | 2010/0065844 A1 | 3/2010 | Tokunaga |
| 7,674,650 B2 | 3/2010 | Akimoto et al. | | 2010/0079169 A1 | 4/2010 | Kim et al. |
| 7,732,819 B2 | 6/2010 | Akimoto et al. | | 2010/0092800 A1 | 4/2010 | Itagaki et al. |
| 7,940,085 B2 | 5/2011 | Kim et al. | | 2010/0109002 A1 | 5/2010 | Itagaki et al. |
| 8,217,680 B2 | 7/2012 | Kim et al. | | 2011/0003429 A1 | 1/2011 | Oikawa et al. |
| 2001/0013607 A1 | 8/2001 | Miyasaka | | 2011/0114945 A1 | 5/2011 | Yamazaki et al. |
| 2001/0032986 A1 | 10/2001 | Miyasaka | | 2011/0127518 A1* | 6/2011 | Jung et al. ............... 257/43 |
| 2001/0046027 A1 | 11/2001 | Tai et al. | | 2011/0175647 A1 | 7/2011 | Kim et al. |
| 2002/0028584 A1* | 3/2002 | Oku et al. ............ 438/762 | | 2011/0216566 A1 | 9/2011 | Kamata |
| 2002/0056838 A1 | 5/2002 | Ogawa | | 2012/0138922 A1 | 6/2012 | Yamazaki et al. |
| 2002/0132454 A1 | 9/2002 | Ohtsu et al. | | 2013/0153892 A1 | 6/2013 | Sasaki et al. |
| 2003/0189401 A1 | 10/2003 | Kido et al. | | 2013/0264563 A1 | 10/2013 | Okazaki et al. |
| 2003/0218222 A1 | 11/2003 | Wager et al. | | 2013/0270549 A1 | 10/2013 | Okazaki et al. |
| 2004/0038446 A1 | 2/2004 | Takeda et al. | | | | |
| 2004/0127038 A1 | 7/2004 | Carcia et al. | | FOREIGN PATENT DOCUMENTS | | |
| 2005/0017302 A1 | 1/2005 | Hoffman | | | | |
| 2005/0199959 A1 | 9/2005 | Chiang et al. | | CN | 101714870 | 5/2010 |
| 2006/0035452 A1 | 2/2006 | Carcia et al. | | EP | 1737044 A | 12/2006 |
| 2006/0043377 A1 | 3/2006 | Hoffman et al. | | EP | 2172972 A | 4/2010 |
| 2006/0091793 A1 | 5/2006 | Baude et al. | | EP | 2226847 A | 9/2010 |
| 2006/0108529 A1 | 5/2006 | Saito et al. | | JP | 60-198861 A | 10/1985 |
| 2006/0108636 A1 | 5/2006 | Sano et al. | | JP | 63-210022 A | 8/1988 |
| 2006/0110867 A1 | 5/2006 | Yabuta et al. | | JP | 63-210023 A | 8/1988 |
| 2006/0113536 A1 | 6/2006 | Kumomi et al. | | JP | 63-210024 A | 8/1988 |
| 2006/0113539 A1 | 6/2006 | Sano et al. | | JP | 63-215519 A | 9/1988 |
| 2006/0113549 A1 | 6/2006 | Den et al. | | JP | 63-239117 A | 10/1988 |
| 2006/0113565 A1 | 6/2006 | Abe et al. | | JP | 63-265818 A | 11/1988 |
| 2006/0169973 A1 | 8/2006 | Isa et al. | | JP | 05-251705 A | 9/1993 |
| 2006/0170111 A1 | 8/2006 | Isa et al. | | JP | 06-275697 A | 9/1994 |
| 2006/0197092 A1 | 9/2006 | Hoffman et al. | | JP | 08-264794 A | 10/1996 |
| 2006/0208977 A1 | 9/2006 | Kimura | | JP | 11-505377 | 5/1999 |
| 2006/0228974 A1 | 10/2006 | Thelss et al. | | JP | 2000-044236 A | 2/2000 |
| 2006/0231882 A1 | 10/2006 | Kim et al. | | JP | 2000-150900 A | 5/2000 |
| 2006/0238135 A1 | 10/2006 | Kimura | | JP | 2002-076356 A | 3/2002 |
| 2006/0244107 A1 | 11/2006 | Sugihara et al. | | JP | 2002-289859 A | 10/2002 |
| 2006/0284171 A1 | 12/2006 | Levy et al. | | JP | 2003-086000 A | 3/2003 |
| 2006/0284172 A1 | 12/2006 | Ishii | | JP | 2003-086808 A | 3/2003 |
| 2006/0292777 A1 | 12/2006 | Dunbar | | JP | 2004-103957 A | 4/2004 |
| 2007/0024187 A1 | 2/2007 | Shin et al. | | JP | 2004-273614 A | 9/2004 |
| 2007/0046191 A1 | 3/2007 | Saito | | JP | 2004-273732 A | 9/2004 |
| 2007/0052025 A1 | 3/2007 | Yabuta | | JP | 2007-096055 A | 4/2007 |
| 2007/0054507 A1 | 3/2007 | Kaji et al. | | JP | 2007-123861 A | 5/2007 |
| 2007/0090365 A1 | 4/2007 | Hayashi et al. | | JP | 2009-224479 A | 10/2009 |
| 2007/0108446 A1 | 5/2007 | Akimoto | | JP | 2010-087518 A | 4/2010 |
| 2007/0152217 A1 | 7/2007 | Lai et al. | | JP | 2011-103370 A | 5/2011 |
| 2007/0172591 A1 | 7/2007 | Seo et al. | | WO | WO-2004/114391 | 12/2004 |
| 2007/0187678 A1 | 8/2007 | Hirao et al. | | | | |
| 2007/0187760 A1 | 8/2007 | Furuta et al. | | | | |
| 2007/0194379 A1 | 8/2007 | Hosono et al. | | OTHER PUBLICATIONS | | |

International Search Report (Application No. PCT/JP2013/060766) Dated Jul. 9, 2013.

Written Opinion (Application No. PCT/JP2013/060766) Dated Jul. 9, 2013.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ca—Zn—O TFTs for Flat Panel Displays,", AM-FPD '08 Digest Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao. T. et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Ble Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFe2O4, and YB2Fe3O7 Types of Structures for Compounds in the In2O3 and Sc2O3-A2O3-BO Systems [A, Fe, Ga, Or Al, B: Mg, Mn, Fe, Ni, Cu,Or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

*Primary Examiner* — Colleen A Matthews
*Assistant Examiner* — Junaiden Mirsalahuddin
(74) *Attorney, Agent, or Firm* — Eric J. Robinson; Robinson Intellectual Property Law Office, P.C.

(57) ABSTRACT

Electric characteristics of a semiconductor device using an oxide semiconductor are improved. Further, a highly reliable semiconductor device in which a variation in electric characteristics with time or a variation in electric characteristics due to a gate BT stress test with light irradiation is small is manufactured. A transistor includes a gate electrode, an oxide semiconductor film overlapping with part of the gate electrode with a gate insulating film therebetween, and a pair of electrodes in contact with the oxide semiconductor film. The gate insulating film is an insulating film whose film density is higher than or equal to 2.26 g/cm$^3$ and lower than or equal to 2.63 g/cm$^3$ and whose spin density of a signal with a g value of 2.001 is $2\times10^{15}$ spins/cm$^3$ or less in electron spin resonance.

15 Claims, 19 Drawing Sheets

SEMICONDUCTOR DEVICE

TECHNICAL FIELD

The present invention relates to a semiconductor device including a field-effect transistor.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that, in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

REFERENCE

Patent Documents

[Patent Document 1] Japanese Published Patent Application No. 2007-123861
[Patent Document 2] Japanese Published Patent Application No. 2007-096055

DISCLOSURE OF INVENTION

In the case where the trap level (also referred to as interface level) is present at the interface between an oxide semiconductor film and a gate insulating film or in the gate insulating film in a transistor using an oxide semiconductor, a shift in the threshold voltage of the transistor and an increase in the subthreshold swing (S value) showing a gate voltage needed for changing the drain current by one digit when the transistor is turned on are caused. As a result, there is a problem in that electric characteristics vary among transistors.

Further, in the case where the trap level is present at the interface between the oxide semiconductor film and the gate insulating film or in the gate insulating film, electric characteristics of the transistor (typically threshold voltage) are changed with time or changed due to a gate BT (bias-temperature) stress test with light irradiation.

In view of this, an object of one embodiment of the present invention is to improve electric characteristics of a semiconductor device using an oxide semiconductor. Another object of one embodiment of the present invention is to manufacture a highly reliable semiconductor device in which a variation in electric characteristics with time or a variation in electric characteristics due to a gate BT stress test with light irradiation is small.

According to one embodiment of the present invention, in a transistor including a gate electrode, an oxide semiconductor film overlapping with part of the gate electrode with a gate insulating film therebetween, and a pair of electrodes in contact with the oxide semiconductor film, one or more insulating films in contact with the oxide semiconductor film have high film density and few defects.

One embodiment of the present invention is a transistor including a gate electrode; an oxide semiconductor film overlapping with part of the gate electrode with a gate insulating film therebetween; and a pair of electrodes in contact with the oxide semiconductor film. The gate insulating film is an insulating film whose film density is higher than or equal to 2.26 g/cm$^3$ and lower than or equal to 2.63 g/cm$^3$ and whose spin density of a signal with a g value of 2.001 is $2\times10^{15}$ spins/cm$^3$ or less in electron spin resonance.

Another embodiment of the present invention is a transistor including a gate electrode; an oxide semiconductor film overlapping with part of the gate electrode with a gate insulating film therebetween; a pair of electrodes in contact with the oxide semiconductor film; and an insulating film in contact with a surface of the oxide semiconductor film which is opposite to a surface of the oxide semiconductor film in contact with the gate insulating film. The gate insulating film and the insulating film are each an insulating film whose film density is higher than or equal to 2.26 g/cm$^3$ and lower than or equal to 2.63 g/cm$^3$ and whose spin density of a signal with a g value of 2.001 is $2\times10^{15}$ spins/cm$^3$ or less in electron spin resonance.

Note that the gate insulating film and the insulating film in contact with the surface of the oxide semiconductor film which is opposite to the surface of the oxide semiconductor film in contact with the gate insulating film contain silicon oxide or silicon oxynitride.

In a transistor including an oxide semiconductor film, an insulating film with high film density and few defects is used for an insulating film in contact with the oxide semiconductor film; thus, the transistor can have excellent electric characteristics in which a shift in the threshold voltage of the transistor and a variation in electric characteristics are small. In addition, a highly reliable transistor in which a variation in electric characteristics with time or a variation in electric characteristics due to a gate BT stress test with light irradiation is small can be manufactured.

BEST MODE FOR CARRYING OUT THE INVENTION

Figure 1A:
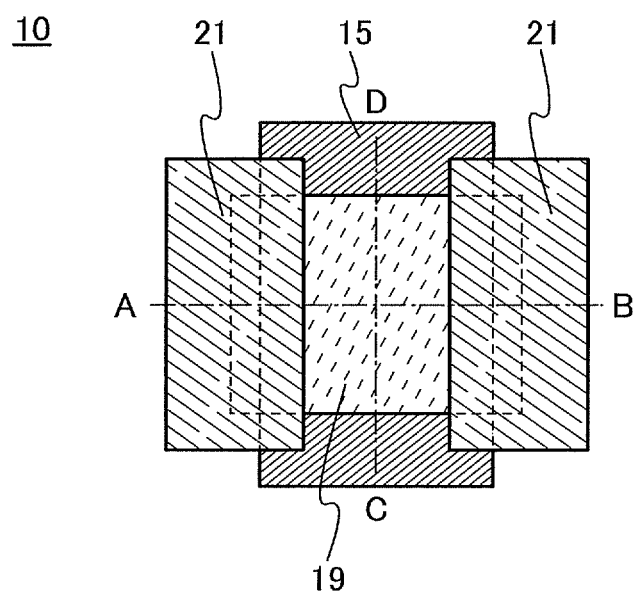
FIGS. 1A to 1C are a top view and cross-sectional views illustrating one embodiment of a transistor.

Hereinafter, embodiments and examples of the present invention will be described in detail with reference to the accompanying drawings. Note that the present invention is not limited to the following description and it is easily understood by those skilled in the art that the mode and details can be variously changed without departing from the scope and spirit of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that, in each drawing in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

In this specification, in the case where an etching step is performed after a photolithography step, a mask formed in the photolithography step is removed after the etching step.

Embodiment 1

In this embodiment, a semiconductor device which is one embodiment of the present invention, and a method for manufacturing the semiconductor device will be described with reference to drawings.

Figure 1C:
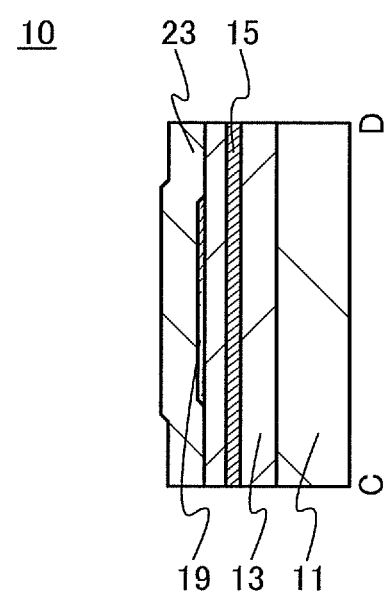
Figure 1B:
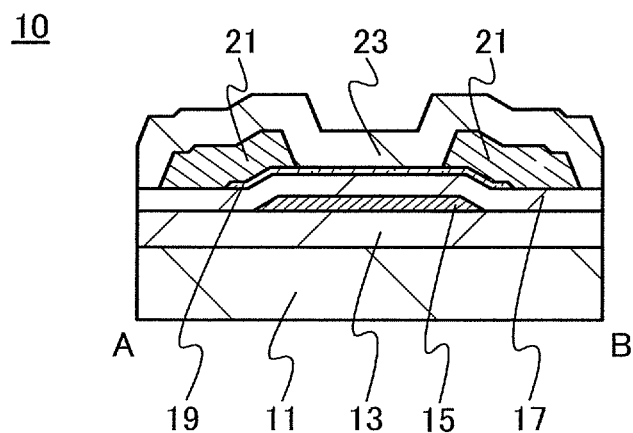

FIGS. 1A to 1C are a top view and cross-sectional views of a transistor 10 included in a semiconductor device. FIG. 1A is a top view of the transistor 10, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, a base insulating film 13, some components of the transistor 10 (e.g., a gate insulating film 17), an insulating film 23, and the like are not illustrated for simplicity.

The transistor 10 illustrated in FIGS. 1B and 1C includes a gate electrode 15 over the base insulating film 13, the gate insulating film 17 over the base insulating film 13 and the gate electrode 15, an oxide semiconductor film 19 overlapping with the gate electrode 15 with the gate insulating film 17 interposed therebetween, and a pair of electrodes 21 in contact with the oxide semiconductor film 19. In addition, the insulating film 23 covering the gate insulating film 17, the oxide semiconductor film 19, and the pair of electrodes 21 is provided.

In the transistor 10 described in this embodiment, the gate insulating film 17 is an insulating film with high film density and few defects. The film density of the gate insulating film 17 is high; typically, the film density of the gate insulating film 17 is higher than or equal to 2.26 g/cm$^3$ and lower than or equal to 2.63 g/cm$^3$ that is the theoretical value of film density, preferably higher than or equal to 2.30 g/cm$^3$ and lower than or equal to 2.63 g/cm$^3$. Dangling bonds of silicon contained in the gate insulating film 17 are extremely few; the spin density of a signal of E'-center (g value: 2.001) showing dangling bonds of silicon is 2×10$^{15}$ spins/cm$^3$ or less, preferably the lower limit of detection (1×10$^{15}$ spins/cm$^3$) or less in electron spin resonance (ESR). For this reason, a shift in the threshold voltage of the transistor 10 including the gate insulating film 17 is small, and thus the transistor 10 has excellent electric characteristics.

As the insulating film for the gate insulating film 17, for example, a film of silicon oxide, silicon oxynitride, or the like having a thickness greater than or equal to 5 nm and less than or equal to 400 nm, preferably greater than or equal to 10 nm and less than or equal to 300 nm, more preferably greater than or equal to 50 nm and less than or equal to 250 nm can be used.

Next, other details of the transistor 10 will be described.

There is no particular limitation on a material and the like of the substrate 11 as long as the material has heat resistance high enough to withstand at least heat treatment performed later. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 11.

Still further alternatively, a flexible substrate may be used as the substrate 11, and the base insulating film 13 and the transistor 10 may be provided directly on the flexible substrate. Alternatively, a separation layer may be provided between the substrate 11 and the base insulating film 13. The separation layer can be used when part or the whole of a semiconductor device formed over the separation layer is completed and separated from the substrate 11 and transferred to another substrate. In such a case, the transistor 10 can be transferred to a substrate having low heat resistance or a flexible substrate as well.

Typical examples of the base insulating film 13 are films of silicon oxide, silicon oxynitride, silicon nitride, silicon nitride oxide, gallium oxide, hafnium oxide, yttrium oxide, aluminum oxide, aluminum oxynitride, and the like. When silicon nitride, gallium oxide, hafnium oxide, yttrium oxide, aluminum oxide, or the like is used for the base insulating film 13, diffusion of impurities such as alkali metal, water, or hydrogen from the substrate 11 to the oxide semiconductor film 19 can be suppressed.

The gate electrode 15 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. The gate electrode 15 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 15 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, the gate electrode 15 can have a stacked structure using the above light-transmitting conductive material and the above metal element.

Further, between the gate electrode 15 and the gate insulating film 17, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like is preferably provided. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and a so-called normally-off switching element can be achieved. For example, in the case of using an In—Ga—Zn-based oxynitride semiconductor film, an In—Ga—Zn-based oxynitride semiconductor film having a higher nitrogen concentration than at least the oxide semiconductor film 19, specifically, an In—Ga—Zn-based oxynitride semiconductor film having a nitrogen concentration of 7 at. % or higher is used.

The oxide semiconductor film 19 preferably contains at least indium (In) or zinc (Zn). Alternatively, the oxide semiconductor film 19 preferably contains both In and Zn. In order to reduce a variation in electric characteristics of the transistors including the oxide semiconductor film, the oxide semiconductor film 19 preferably contains one or more stabilizers in addition to In or Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, a single-component metal oxide such as indium oxide, tin oxide, or zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, or an In—W-based metal oxide; a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn—based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide can be used.

For the above-listed metal oxides, an In—Ga—Zn-based metal oxide is, for example, an oxide whose main components are In, Ga, and Zn, and there is no particular limitation on the ratio of In:Ga:Zn. Further, the In—Ga—Zn-based oxide may contain a metal element other than In, Ga, and Zn.

Alternatively, a material represented by $InMO_3(ZnO)_m$ (m>0, m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

For example, an In—Ga—Zn-based metal oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or any of oxides whose composition is in the neighborhood of the above compositions can be used. Alternatively, an In—Sn—Zn-based metal oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used. Note that a proportion of each atom in the atomic ratio of the metal oxide varies within a range of ±20% as an error.

However, without limitation to the materials given above, a material with an appropriate composition may be used depending on needed semiconductor characteristics and electric characteristics (e.g., field-effect mobility, threshold voltage, and the like). In order to obtain needed semiconductor characteristics and electric characteristics, it is preferable that the carrier density, the impurity concentration, the defect density, the atomic ratio of a metal element to oxygen, the interatomic distance, the density, and the like be set to be appropriate.

For example, it is relatively easy to obtain high mobility with an In—Sn—Zn-based metal oxide. However, it is possible to obtain high mobility also with an In—Ga—Zn-based metal oxide by reducing the defect density in a bulk.

Note that the energy gap of a metal oxide that can form the oxide semiconductor film 19 is 2 eV or more, preferably 2.5 eV or more, further preferably 3 eV or more. In this manner, the off-state current of a transistor can be reduced by using an oxide semiconductor having a wide energy gap.

Note that the oxide semiconductor film 19 may have an amorphous structure, a single crystal structure, or a polycrystalline structure.

The oxide semiconductor film 19 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystal oxide semiconductor). For example, the oxide semiconductor film 19 may include a CAAC-OS. In the CAAC-OS, for example, c-axes are aligned, and a-axes and/or b-axes are not macroscopically aligned.

For example, the oxide semiconductor film 19 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, the oxide semiconductor film 19 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film 19 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that the oxide semiconductor film 19 may be in a single-crystal state, for example.

The oxide semiconductor film 19 preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Here, details of the CAAC-OS film are described. Note that in most cases, a crystal part in the CAAC-OS film fits inside a cube whose one side is less than 100 nm In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Note that the oxide semiconductor film 19 may have a structure in which a plurality of oxide semiconductor films is stacked. For example, the oxide semiconductor film 19 may be a stack of a first oxide semiconductor film and a second oxide semiconductor film that are formed using metal oxides with different compositions. For example, the first oxide semiconductor film may be formed using any of a two-component metal oxide, a three-component metal oxide, and a four-component metal oxide, and the second oxide semiconductor film may be formed using any of these which is different from the oxide for the first oxide semiconductor film.

Further, the constituent elements of the first oxide semiconductor film and the second oxide semiconductor film may be the same but the compositions of the constituent elements of the first oxide semiconductor film and the second oxide semiconductor film may be different from each other. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3. Note that a proportion of each atom in the atomic ratio of the oxide semiconductor varies within a range of ±20% as an error.

In this case, one of the first oxide semiconductor film and the second oxide semiconductor film which is closer to the gate electrode (on a channel side) preferably contains In and Ga such that their contents satisfy In>Ga. The other which is farther from the gate electrode (on a back channel side) preferably contains In and Ga such that their contents satisfy In≥Ga.

In an oxide semiconductor, the s orbital of heavy metal mainly contributes to carrier transfer, and overlap of the s orbitals is likely to increase when the In content in the oxide semiconductor is increased. Therefore, an oxide having a composition of In>Ga has higher mobility than an oxide having a composition of In≤Ga. Further, the formation energy of oxygen vacancy is larger and thus oxygen vacancy is less likely to occur in Ga than in In; thus, the oxide having a composition of In≤Ga has more stable characteristics than the oxide having a composition of In>Ga.

An oxide semiconductor having a composition of In>Ga is used on the channel side and an oxide semiconductor having a composition of In≥Ga is used on the back channel side, whereby the field-effect mobility and reliability of the transistor can be further improved.

Further, oxide semiconductors having different crystallinities may be used for the first oxide semiconductor film and the second oxide semiconductor film. That is, the first oxide semiconductor film and the second oxide semiconductor film may be formed using a combination of any of a single crystal oxide semiconductor, a polycrystalline oxide semiconductor, a microcrystalline oxide semiconductor, an amorphous oxide semiconductor, and a CAAC-OS as appropriate. When an amorphous oxide semiconductor film is used for at least one of the first oxide semiconductor film and the second oxide semiconductor film, internal stress or external stress of the oxide semiconductor film 19 is relieved, variation in characteristics of a transistor is reduced, and the reliability of the transistor can be further improved.

The thickness of the oxide semiconductor film 19 is greater than or equal to 1 nm and less than or equal to 100 nm, preferably greater than or equal to 1 nm and less than or equal to 50 nm, further preferably greater than or equal to 1 nm and less than or equal to 30 nm, still further preferably greater than or equal to 3 nm and less than or equal to 20 nm.

The concentration of an alkali metal or an alkaline earth metal in the oxide semiconductor film 19 is preferably lower than or equal to $1\times10^{18}$ atoms/cm$^3$, more preferably lower than or equal to $2\times10^{16}$ atoms/cm$^3$. When an alkali metal or an alkaline earth metal is bonded to an oxide semiconductor, carriers are generated in some cases, which cause an increase in the off-state current of the transistor.

The oxide semiconductor film 19 may contain nitrogen at a concentration lower than or equal to $5\times10^{18}$ atoms/cm$^3$.

The pair of electrodes 21 is formed with a single-layer structure or a stacked structure including, as a conductive material, any of metals such as aluminum, titanium, chromium, nickel, copper, yttrium, zirconium, molybdenum, silver, tantalum, and tungsten or an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The insulating film 23 is formed with a single-layer structure or a stacked structure using one or more of silicon oxide, silicon oxynitride, silicon nitride oxide, silicon nitride, aluminum oxide, aluminum oxynitride, aluminum nitride oxide, aluminum nitride, and the like to a thickness greater than or equal to 30 nm and less than or equal to 500 nm, preferably greater than or equal to 100 nm and less than or equal to 400 nm.

Like the gate insulating film 17, the insulating film 23 is formed using an insulating film with high film density and few defects, typically an insulating film having a film density higher than or equal to 2.26 g/cm$^3$ and lower than or equal to 2.63 g/cm$^3$ that is the theoretical value of film density, preferably higher than or equal to 2.30 g/cm$^3$ and lower than or equal to 2.63 g/cm$^3$. The spin density of a signal with a g value of 2.001 is $2\times10^{15}$ spins/cm$^3$ or less, preferably the lower limit of detection ($1\times10^{15}$ spins/cm$^3$) or less in electron spin resonance. With the use of such an insulating film, a shift in the threshold voltage of the transistor can be reduced.

In the case where the oxide semiconductor film 19 is formed using a metal oxide containing indium, the concentration of indium in the insulating film 23 is higher than or equal to $1\times10^{15}$ atoms/cm$^3$ and lower than or equal to $5\times10^{17}$ atoms/cm$^3$. The reason why the concentration of indium in the insulating film 23 is high is that indium in the oxide semiconductor film 19 is diffused into the insulating film 23 during the formation of the insulating film 23. Note that when the film formation temperature of the insulating film 23 is, for example, 350° C. or higher, the indium content in the insulating film 23 is increased.

Next, a method for manufacturing the transistor in the semiconductor device illustrated in FIGS. 1A to 1C will be described with reference to FIGS. 2A to 2D.

Figure 2A:
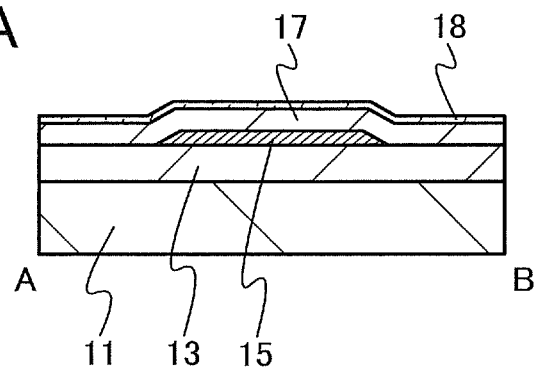
FIGS. 2A to 2D are cross-sectional views illustrating one embodiment of a method for manufacturing a transistor.

As illustrated in FIG. 2A, the base insulating film 13 and the gate electrode 15 are formed over the substrate 11, and then the gate insulating film 17 is formed over the gate electrode 15. Next, an oxide semiconductor film 18 is formed over the gate insulating film 17.

The base insulating film 13 is formed by a sputtering method, a CVD method, or the like. Here, a silicon oxynitride film having a thickness of 100 nm is formed by a CVD method.

A method for forming the gate electrode 15 is described below. First, a conductive film is formed by a sputtering method, a CVD method, an evaporation method, or the like. Then, a mask is formed over the conductive film by a photolithography step. Next, part of the conductive film is etched with the use of the mask to form the gate electrode 15. After that, the mask is removed.

Note that the gate electrode 15 may be formed by an electrolytic plating method, a printing method, an inkjet method, or the like instead of the above formation method.

Here, a 100 nm-thick tungsten film is formed by a sputtering method. Next, a mask is formed by a photolithography step, and the tungsten film is subjected to dry etching with the use of the mask to form the gate electrode 15.

As the gate insulating film 17, a silicon oxide film or a silicon oxynitride film is formed under the following conditions: a substrate placed in a process chamber evacuated to a vacuum level in a plasma CVD apparatus is held at a temperature higher than or equal to 300° C. and lower than or equal to 400° C., preferably higher than or equal to 320° C. and lower than or equal to 380° C.; a source gas is introduced into the process chamber to set the pressure in the process chamber to be higher than or equal to 30 Pa and lower than or equal to 250 Pa, preferably higher than or equal to 40 Pa and lower than or equal to 200 Pa; and the high-frequency power supplied to an electrode provided in the process chamber is greater than or equal to 0.17 W/cm$^2$ and less than or equal to 0.5 W/cm$^2$, preferably greater than or equal to 0.26 W/cm$^2$ and less than or equal to 0.35 W/cm$^2$.

As a source gas of the gate insulating film 17, a deposition gas containing silicon and an oxidation gas is preferably used. Typical examples of the deposition gas containing silicon include silane, disilane, trisilane, and silane fluoride. Examples of the oxidation gas include oxygen, ozone, dinitrogen monoxide, nitrogen dioxide, and dry air.

In the formation conditions of the gate insulating film 17, the power density of high-frequency power is made high as described above; thus, the efficiency of decomposing the source gas in plasma is improved, oxygen radicals are increased, and oxidation of the deposition gas containing silicon is promoted. Further, by setting the substrate temperature in the above range, the bonding strength between silicon and oxygen is improved. Consequently, as the gate insulating film, an insulating film with high film density and few dangling bonds of silicon, that is, a silicon oxide film or a silicon oxynitride film with high film density and few defects can be formed.

Here, a 250 nm-thick silicon oxynitride film is formed by a CVD method, whereby the gate insulating film 17 is formed.

The oxide semiconductor film 18 is formed by a sputtering method, a coating method, a pulsed laser deposition method, a laser ablation method, or the like.

In the case where the oxide semiconductor film 18 is formed by a sputtering method, as a power supply device for generating plasma, an RF power supply device, an AC power supply device, a DC power supply device, or the like can be used as appropriate.

As a sputtering gas, a rare gas (typically argon) atmosphere, an oxygen gas atmosphere, or a mixed gas atmosphere of a rare gas and oxygen is used as appropriate. In the case of using the mixed gas of a rare gas and oxygen, the proportion of oxygen is preferably higher than that of a rare gas.

Further, a target may be selected as appropriate depending on composition of the oxide semiconductor film 18 to be formed.

For example, in the case where the oxide semiconductor film 18 is formed by a sputtering method, deposition is performed at a substrate temperature higher than or equal to 150° C. and lower than or equal to 750° C., preferably higher than or equal to 150° C. and lower than or equal to 450° C., further preferably higher than or equal to 200° C. and lower than or equal to 350° C. to form the oxide semiconductor film 18, whereby a CAAC-OS film can be formed.

For example, the CAAC-OS film is formed by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than the strain point of the substrate, preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based metal oxide target is described below.

The In—Ga—Zn-based metal oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Figure 2B:
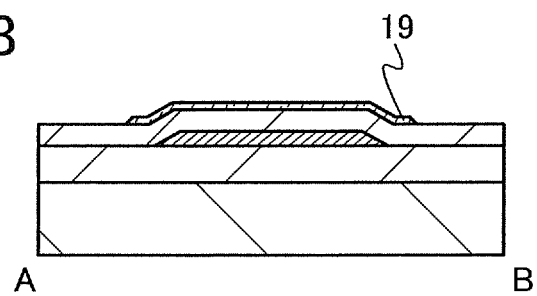

Next, as illustrated in FIG. 2B, the oxide semiconductor film 19 that has been subjected to element isolation is formed over the gate insulating film 17 so as to overlap with part of the gate electrode 15. The oxide semiconductor film 19 that has been subjected to element isolation can be formed in such a manner that a mask is formed over the oxide semiconductor film 18 through a photolithography step and then part of the oxide semiconductor film 18 is etched with the use of the mask.

Alternatively, by using a printing method for forming the oxide semiconductor film 19, the oxide semiconductor film 19 that is subjected to element isolation can be formed directly.

Here, the oxide semiconductor film 18 is formed to a thickness of 35 nm by a sputtering method, a mask is formed over the oxide semiconductor film 18, and part of the oxide semiconductor film 18 is selectively etched, so that the oxide semiconductor film 19 is formed. After that, the mask is removed.

Figure 2C:
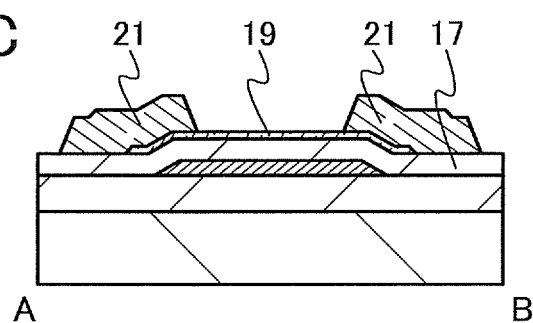

Next, as illustrated in FIG. 2C, the pair of electrodes 21 is formed.

A method for forming the pair of electrodes 21 is described below. First, a conductive film is formed by a sputtering method, a CVD method, an evaporation method, or the like. Then, a mask is formed over the conductive film by a photolithography step. Next, the conductive film is etched with the use of the mask to form the pair of electrodes 21. After that, the mask is removed.

Here, a 50 nm-thick tungsten film, a 400 nm-thick aluminum film, and a 100 nm-thick titanium film are formed by a sputtering method in this order to form a stack. Next, a mask is formed over the titanium film by a photolithography step and the tungsten film, the aluminum film, and the titanium film are subjected to dry etching with the use of the mask to form the pair of electrodes 21.

After the pair of electrodes 21 is formed, cleaning treatment is preferably performed to remove an etching residue. A short circuit of the pair of electrodes 21 can be suppressed by this cleaning treatment. The cleaning treatment can be performed using an alkaline solution such as a tetramethylammonium hydroxide (TMAH) solution, an acidic solution such as a diluted hydrofluoric acid solution, an oxalic acid solution, or a phosphorus acid solution, or water.

Figure 2D:
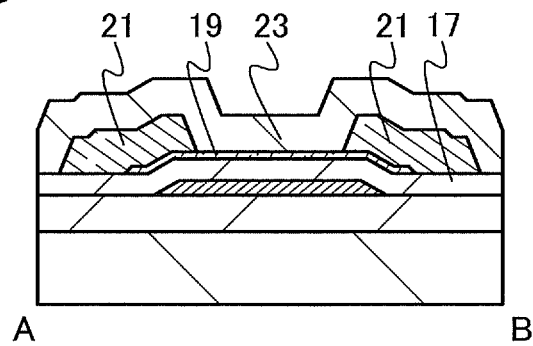

Next, as illustrated in FIG. 2D, the insulating film 23 is formed.

The insulating film 23 is formed by a CVD method or a sputtering method.

Note that conditions similar to those for forming the gate insulating film 17 may be employed to form an insulating film with high film density and few defects as the insulating film 23.

As the insulating film 23, a silicon oxide film or a silicon oxynitride film may be formed under the following conditions: a substrate is placed in a process chamber evacuated to a vacuum level in a plasma CVD apparatus; the substrate is held at a temperature higher than or equal to 180° C. and lower than or equal to 250° C., preferably higher than or equal to 180° C. and lower than or equal to 230° C.; a source gas is introduced into the process chamber to set a pressure in the process chamber to be higher than or equal to 100 Pa and lower than or equal to 250 Pa, preferably higher than or equal to 100 Pa and lower than or equal to 200 Pa; and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the process chamber.

As a source gas of the insulating film 23, a deposition gas containing silicon and an oxidation gas is preferably used. Typical examples of the deposition gas containing silicon include silane, disilane, trisilane, and silane fluoride. Examples of the oxidation gas include oxygen, ozone, dinitrogen monoxide, and nitrogen dioxide.

As the deposition condition of the insulating film 23, the high-frequency power with the above power density is supplied in the process chamber under the above pressure, whereby the decomposition efficiency of the source gas in plasma is increased, oxygen radicals are increased, and oxidation of the deposition gas containing silicon is promoted; thus, the oxygen content in the insulating film 23 is in excess of that of the stoichiometric composition. On the other hand, in the film formed at a substrate temperature within the above temperature range, the bond between silicon and oxygen is weak, and accordingly, part of oxygen in the film is released by heat treatment in the later step. As a result, an oxide insulating film in which the oxygen content is in excess of that of the stoichiometric composition can be formed. In other words, an oxide insulating film from which part of contained oxygen is released by heating can be formed.

By providing, as the insulating film 23, an oxide insulating film in which the oxygen content is in excess of that of the stoichiometric composition, oxygen can be diffused to the oxide semiconductor film 19 through the heat treatment. As a result, oxygen vacancies in the oxide semiconductor film 19 can be filled.

Next, heat treatment is performed. The heat treatment is performed typically at a temperature higher than or equal to 150° C. and lower than the strain point of the substrate, preferably higher than or equal to 250° C. and lower than or equal to 450° C., further preferably higher than or equal to 300° C. and lower than or equal to 450° C.

An electric furnace, a rapid thermal annealing (RTA) apparatus, or the like can be used for the heat treatment. With the use of an RTA apparatus, the heat treatment can be performed at a temperature higher than or equal to the strain point of the substrate if the heating time is short. Thus, the time during which oxygen is diffused from the insulating film 23 to the oxide semiconductor film 19 can be shortened.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like).

Here, the heat treatment is performed at 350° C. for 1 hour in an atmosphere of nitrogen and oxygen.

Through the above process, a transistor in which a shift in threshold voltage is small and which has excellent characteristics can be manufactured. In addition, a highly reliable transistor in which a variation in electric characteristics with time or a variation in electric characteristics due to a gate BT stress test with light irradiation is small can be manufactured.

Next, a transistor having a structure different from that in FIGS. 1A to 1C will be described with reference to FIG. 3 and FIGS. 4A to 4E. Unlike in the transistor 10 illustrated in FIGS. 1A to 1C, a gate insulating film, and an insulating film over an oxide semiconductor film have a stacked structure, which will be described with reference to FIG. 3.

Figure 3:
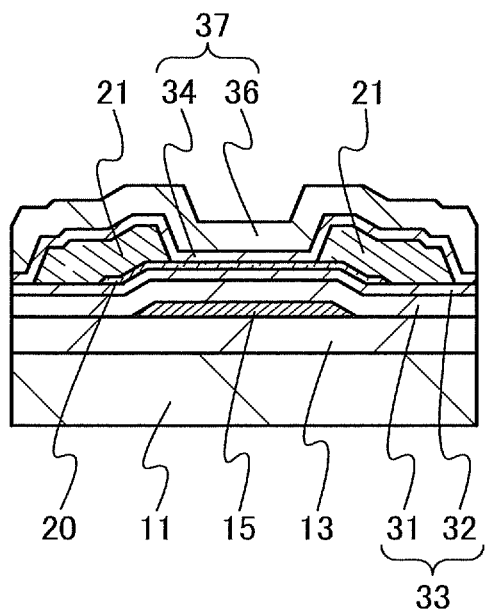
FIG. 3 is a cross-sectional view illustrating one embodiment of a transistor.

A transistor 30 illustrated in FIG. 3 includes the base insulating film 13 over the substrate 11 and the gate electrode 15 over the base insulating film 13. In addition, a gate insulating film 33 including an insulating film 31 and an insulating film 32 is provided over the base insulating film 13 and the gate electrode 15. An oxide semiconductor film 20 is provided so as to overlap with the gate electrode 15 with the gate insulating film 33 interposed therebetween, and the pair of electrodes 21 is provided in contact with the oxide semiconductor film 20. Further, a protective film 37 including an insulating film 34 and an insulating film 36 is formed over the gate insulating film 33, the oxide semiconductor film 20, and the pair of electrodes 21.

The gate insulating film 33 has a stacked structure of the insulating film 31 and the insulating film 32. For the insulating film 31, silicon nitride oxide, silicon nitride, aluminum oxide, hafnium oxide, gallium oxide, a Ga—Zn-based metal oxide, or the like may be used. As the insulating film 31, an oxide insulating film from which oxygen is released by heating may be used. With the use of, as the insulating film 31, a film from which oxygen is released by heating, interface states at the interface between the insulating film 32 and the oxide semiconductor film 20 can be reduced; thus, a transistor with less variation in electric characteristics can be provided. Further, when an insulating film which blocks oxygen, hydrogen, water, and the like is provided as the insulating film 31, oxygen can be prevented from diffusing from the oxide semiconductor film 20 to the outside, and hydrogen and water can be prevented from entering the oxide semiconductor film 20 from the outside. As the insulating film that can block oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

The insulating film 31 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

As the insulating film 31, an insulating film including any of the above materials is formed with a thickness greater than or equal to 5 nm and less than or equal to 400 nm. As the insulating film 32, a silicon oxide film or a silicon oxynitride film is formed with a thickness greater than or equal to 5 nm and less than or equal to 400 nm. Note that the thicknesses of the insulating film 31 and the insulating film 32 may be determined such that the sum of the thicknesses of the two insulating films is within the range of the thickness of the gate insulating film 17 in the transistor 10 in FIGS. 1A to 1C.

The oxide semiconductor film 20 is exposed to plasma generated in an oxidation atmosphere. As the oxidation atmosphere, an atmosphere of oxygen, ozone, dinitrogen monoxide, or the like can be given. As a preferable method of plasma treatment, a parallel plate plasma CVD apparatus is used, plasma is generated under a condition where bias is applied to an upper electrode but is not applied to a lower electrode on which the substrate 11 is placed, and the oxide semiconductor film is exposed to the plasma. As a result, oxygen can be supplied to the oxide semiconductor film 20 with less damage, and the amount of oxygen vacancies in the oxide semiconductor film 20 can be reduced.

In the transistor 30, the insulating film 32 and the insulating film 34 are formed in contact with the oxide semiconductor film 20. Like the gate insulating film 17 illustrated in FIGS. 1A to 1C, the insulating film 32 and the insulating film 34 are each an insulating film with high film density and few defects. The insulating film 32 and the insulating film 34 are each typically an insulating film having a film density higher than or equal to 2.26 g/cm$^3$ and lower than or equal to 2.63 g/cm$^3$ that is the theoretical value of film density, preferably higher than or equal to 2.30 g/cm$^3$ and lower than or equal to 2.63 g/cm$^3$, and whose spin density of a signal with a g value of 2.001 is $2\times10^{15}$ spins/cm$^3$ or less, preferably the lower limit of detection ($1\times10^{15}$ spins/cm$^3$) or less in electron spin resonance. For this reason, a shift in the threshold voltage of the transistor 30 including the gate insulating film 33 including the insulating film 32 is small, and thus the transistor 30 has excellent electric characteristics. Further, with the insulating film 32 that is an insulating film with high film density, impurities can be prevented from entering the oxide semiconductor film 20 from the substrate 11, the base insulating film 13, the gate electrode 15, and the insulating film 31. Furthermore, with the insulating film 34, the amount of oxygen released from the oxide semiconductor film 20 through heat treatment performed after the formation of the insulating film 34 can be reduced; thus, the amount of oxygen vacancies in the oxide semiconductor film 20 can be reduced.

In the case where the oxide semiconductor film 20 is formed using a metal oxide containing indium, the concentration of indium in the insulating film 34 is higher than or equal to $1\times10^{15}$ atoms/cm$^3$ and lower than or equal to $5\times10^{17}$ atoms/cm$^3$. The reason why the concentration of indium in the insulating film 34 is high is that indium in the oxide semiconductor film 20 is diffused into the insulating film 34 during the formation of the insulating film 34. Note that when the film formation temperature of the insulating film 34 is, for example, 350° C. or higher, the indium content in the insulating film 34 is increased.

As each of the insulating film 32 and the insulating film 34, a silicon oxide film, a silicon oxynitride film, or the like can be used.

The insulating film 36 is formed with a single-layer structure or a stacked structure using one or more of silicon oxide, silicon oxynitride, silicon nitride oxide, silicon nitride, aluminum oxide, aluminum oxynitride, aluminum nitride oxide, aluminum nitride, and the like to a thickness greater than or equal to 30 nm and less than or equal to 500 nm, preferably greater than or equal to 100 nm and less than or equal to 400 nm. As the insulating film 36, an oxide insulating film in which the oxygen content is in excess of that of the stoichiometric composition may be provided.

The transistor 30 includes the oxide semiconductor film which has been exposed to the plasma generated in the oxidizing atmosphere and has few oxygen vacancies. Exposed portions of the oxide semiconductor film are covered with the insulating films 32 and 34 with high film density and few defects. Consequently, the transistor has excellent electric characteristics in which a shift in threshold voltage and a variation in electric characteristics are small. In addition, a transistor having excellent electric characteristics in which a variation in electric characteristics with time or a variation in electric characteristics due to a gate BT stress test with light irradiation is small can be manufactured.

Next, a method for manufacturing the transistor illustrated in FIG. 3 will be described with reference to FIGS. 4A to 4E.

Figure 4A:
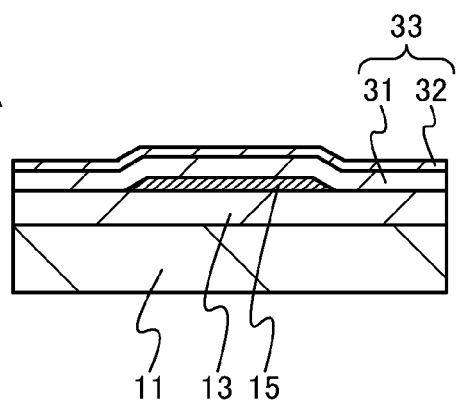
FIGS. 4A to 4E are cross-sectionals views illustrating one embodiment of a method for manufacturing a transistor.

As illustrated in FIG. 4A, the base insulating film 13 and the gate electrode 15 are formed over the substrate 11 as in the process illustrated in FIGS. 2A to 2D. Next, the insulating films 31 and 32 functioning as the gate insulating film 33 are formed.

The insulating film 31 is formed by a CVD method or a sputtering method. The insulating film 32 is formed under conditions similar to those for the gate insulating film 17 in the transistor 10; thus, a silicon oxide film or a silicon oxynitride film with high film density and few defects is formed as the insulating film 32.

Here, as the insulating film 31, a silicon nitride film having a thickness of 50 nm is formed by a CVD method. As the insulating film 32, a silicon oxynitride film having a thickness of 200 nm is formed under conditions similar to those for the gate insulating film 17 in the transistor 10. A silicon oxynitride film with high film density and few defects can be formed under such conditions.

The gate insulating film 33 is formed to have a large thickness and preferably has a stacked structure of a silicon nitride film with a resistivity higher than or equal to $5\times10^{13}$ Ω·cm and lower than or equal to $1\times10^{15}$ Ω·cm and a silicon oxynitride film, whereby in a transistor formed later, electrostatic breakdown caused between the gate electrode 15 and the oxide semiconductor film 20 or between the gate electrode 15 and the pair of electrodes 21 can be suppressed.

Figure 4B:
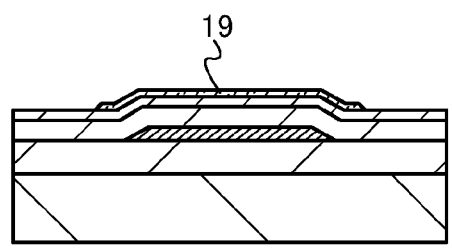

Next, as illustrated in FIG. 4B, the oxide semiconductor film 19 is formed over the gate insulating film 33 as in the process illustrated in FIGS. 2A to 2D.

Figure 4C:
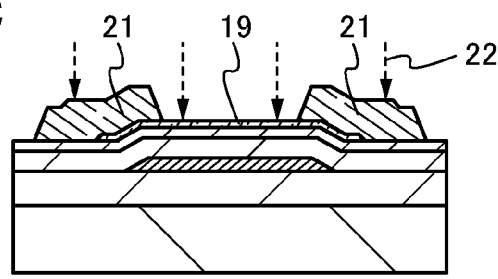
Figure 4D:
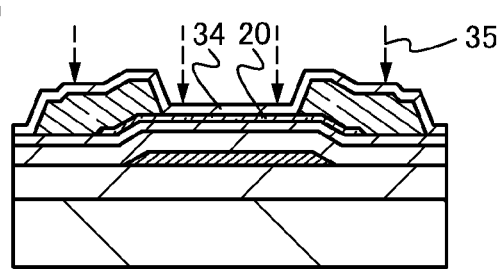

Next, as illustrated in FIG. 4C, the pair of electrodes 21 is formed. Then, the oxide semiconductor film 19 is exposed to plasma generated in an oxidation atmosphere, and oxygen 22 is supplied to the oxide semiconductor film 19, so that the oxide semiconductor film 20 shown in FIG. 4D is formed. As the oxidation atmosphere, an atmosphere of oxygen, ozone, dinitrogen monoxide, or the like can be given. As a preferable method of plasma treatment, plasma is generated under a condition where bias is not applied to a lower electrode on which the substrate 11 is placed, and the oxide semiconductor film 19 is exposed to the plasma. As a result, oxygen can be supplied to the oxide semiconductor film 19 without damage.

Here, the oxide semiconductor film 19 is exposed to oxygen plasma generated in the following manner: dinitrogen monoxide is introduced into the process chamber of the plasma CVD apparatus; and a high-frequency power of 150 W is supplied to an upper electrode provided in the process chamber with a high-frequency power supply of 27.12 MHz.

Next, the insulating film 34 is formed over the oxide semiconductor film 20 and the pair of electrodes 21. Here, a silicon oxynitride film having a thickness of 10 nm is formed under conditions similar to those for the gate insulating film 17 in the transistor 10. A silicon oxynitride film with high film density and few defects can be formed under such conditions.

Next, oxygen 35 may be added to the insulating film 34. As a method for adding the oxygen 35 to the insulating film 34, an ion implantation method, an ion doping method, plasma treatment, or the like can be given. As a result, the insulating film 34 can be an oxide insulating film in which the oxygen content is in excess of that of the stoichiometric composition.

Figure 4E:
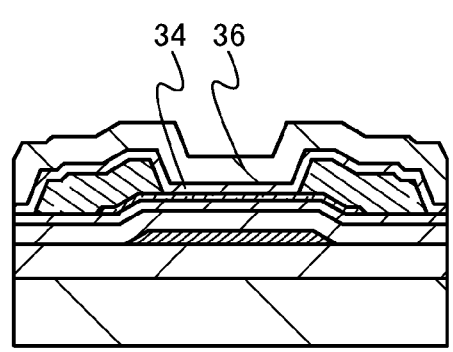

Next, the insulating film 36 is formed over the insulating film 34 as illustrated in FIG. 4E. As the insulating film 36, a silicon oxide film or a silicon oxynitride film is formed under the following conditions: a substrate is placed in a process chamber evacuated to a vacuum level in a plasma CVD apparatus; the substrate is held at a temperature higher than or equal to 180° C. and lower than or equal to 250° C., preferably higher than or equal to 180° C. and lower than or equal to 230° C.; a source gas is introduced into the process chamber to set a pressure in the process chamber to be higher than or equal to 100 Pa and lower than or equal to 250 Pa, preferably higher than or equal to 100 Pa and lower than or equal to 200 Pa; and a high-frequency power greater than or equal to $0.17$ W/cm$^2$ and less than or equal to $0.5$ W/cm$^2$, preferably greater than or equal to $0.25$ W/cm$^2$ and less than or equal to $0.35$ W/cm$^2$ is supplied to an electrode provided in the process chamber.

Next, heat treatment is performed as in the process illustrated in FIGS. 2A to 2D.

Through the above process, a transistor in which the negative shift of the threshold voltage is reduced can be manufactured. In addition, a transistor having excellent electric characteristics in which a shift in threshold voltage and a variation in electric characteristics are small can be manufactured. In addition, a highly reliable transistor in which a variation in electric characteristics with time or a variation in electric characteristics due to a gate BT stress test with light irradiation is small can be manufactured.

Note that the structures, methods, and the like described in this embodiment can be used as appropriate in combination with any of the structures, methods, and the like described in the other embodiments and examples.

Embodiment 2

In this embodiment, a transistor having a different structure from the transistors in Embodiment 1 will be described with reference to FIGS. 5A to 5C. A transistor 100 shown in this embodiment is a top-gate transistor, which is different from the transistors in Embodiment 1.

Figure 5A:
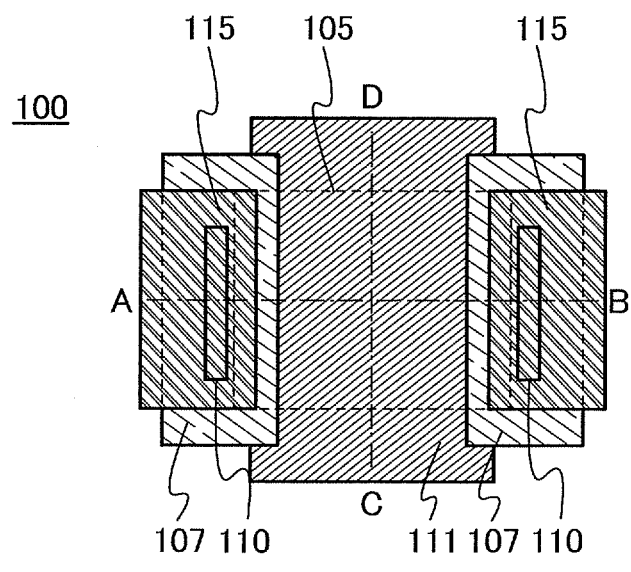
FIGS. 5A to 5C are a top view and cross-sectional views illustrating one embodiment of a transistor.
Figure 5C:
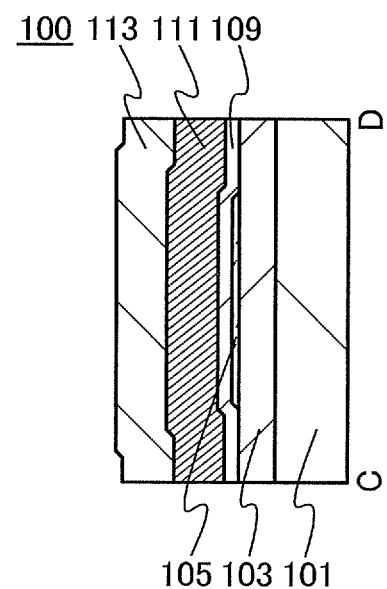
Figure 5B:
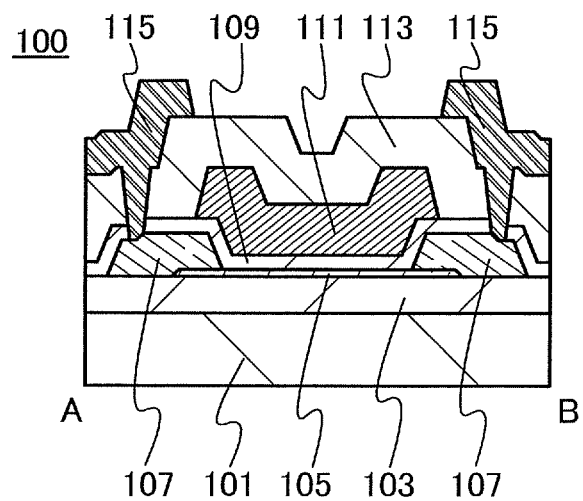

FIG. 5A to 5C are a top view and cross-sectional views of the transistor 100. FIG. 5A is a top view of the transistor 100, FIG. 5B is a cross-sectional view taken along dashed-dotted line A-B in FIG. 5A, and FIG. 5C is a cross-sectional view taken along dashed-dotted line C-D in FIG. 5A. Note that in FIG. 5A, a substrate 101, a base insulating film 103, some components of the transistor 100 (e.g., a gate insulating film 109), an insulating film 113, and the like are not illustrated for simplicity.

The transistor 100 illustrated in FIGS. 5A to 5C includes an oxide semiconductor film 105 over the base insulating film 103, a pair of electrodes 107 in contact with the oxide semiconductor film 105, the gate insulating film 109 in contact with the base insulating film 103, the oxide semiconductor film 105, and the pair of electrodes 107, and a gate electrode 111 overlapping with the oxide semiconductor film 105 with the gate insulating film 109 interposed therebetween. In addition, the insulating film 113 covering the gate insulating film 109 and the gate electrode 111 is provided. Furthermore, wirings 115 may be provided in contact with the pair of electrodes 107 through openings 110 formed in the gate insulating film 109 and the insulating film 113.

In the transistor 100 in this embodiment, the pair of electrodes 107 and the gate electrode 111 overlap with each other with the gate insulating film 109 interposed therebetween. Thus, in the oxide semiconductor film 105, a region facing the gate electrode 111 with the gate insulating film 109 interposed therebetween functions as a channel region, and regions in contact with the pair of electrodes 107 function as a source region and a drain region. In other words, the channel region and the source or drain region are in contact with each other. There is no region functioning as a resistance component between the channel region and the source or drain region. Therefore, the transistor whose on-state current and field-effect mobility are high can be obtained.

In the transistor 100 described in this embodiment, the gate insulating film 109 is an insulating film with high film density and few defects. The film density of the gate insulating film 109 is high; typically, the film density of the gate insulating film 109 is higher than or equal to 2.26 g/cm$^3$ and lower than or equal to 2.63 g/cm$^3$ that is the theoretical value of film density, preferably higher than or equal to 2.30 g/cm$^3$ and lower than or equal to 2.63 g/cm$^3$. Dangling bonds of silicon contained in the gate insulating film 109 are extremely few; the spin density of a signal of E'-center (g value: 2.001) showing dangling bonds of silicon is $2 \times 10^{15}$ spins/cm$^3$ or less, preferably the lower limit of detection ($1 \times 10^{15}$ spins/cm$^3$) or less in electron spin resonance (ESR). For this reason, a shift in the threshold voltage of the transistor 100 including the gate insulating film 109 is small, and thus the transistor 100 has excellent electric characteristics.

The gate insulating film 109 can be formed using silicon oxide or silicon oxynitride, for example.

In the case where the oxide semiconductor film 105 is formed using a metal oxide containing indium, the concentration of indium in the gate insulating film 109 is higher than or equal to $1 \times 10^{15}$ atoms/cm$^3$ and lower than or equal to $5 \times 10^{17}$ atoms/cm$^3$. The reason why the concentration of indium in the gate insulating film 109 is high is that indium in the oxide semiconductor film 105 is diffused into the gate insulating film 109 during the formation of the gate insulating film 109. Note that when the film formation temperature of the gate insulating film 109 is, for example, 350° C. or higher, the indium content in the gate insulating film 109 is increased.

Next, other details of the transistor 100 will be described.

As the substrate 101, a substrate which is given as an example of the substrate 11 in Embodiment 1 can be used as appropriate.

The base insulating film 103 is preferably formed using an oxide insulating film from which part of oxygen is released by heating. As such an oxide insulating film from which part of oxygen is released by heating, an oxide insulating film in which the oxygen content is in excess of that of the stoichiometric composition is preferably used. The oxide insulating film from which part of oxygen is released by heating can make oxygen diffuse into the oxide semiconductor film by heat treatment. Typical examples of the base insulating film 103 are films of silicon oxide, silicon oxynitride, silicon nitride oxide, gallium oxide, hafnium oxide, yttrium oxide, aluminum oxide, aluminum oxynitride, and the like.

The thickness of the base insulating film 103 is greater than or equal to 50 nm, preferably greater than or equal to 200 nm and less than or equal to 3000 nm, further preferably greater than or equal to 300 nm and less than or equal to 1000 nm. With the use of the thick base insulating film 103, the amount of oxygen released from the base insulating film 103 can be increased, and the interface state at the interface between the base insulating film 103 and an oxide semiconductor film formed later can be reduced.

Here, "to release part of oxygen by heating" means that the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis.

In the above structure, the insulating film from which part of oxygen is released by heating may be oxygen-excess silicon oxide (SiO$_x$ (X>2)). In the oxygen-excess silicon oxide (SiO$_x$ (X>2)), the number of oxygen atoms per unit volume is more than twice the number of silicon atoms per unit volume. The number of silicon atoms and the number of oxygen atoms per unit volume are measured by Rutherford backscattering spectrometry.

Here, in TDS analysis, the measurement method of the amount of released oxygen at the oxygen atomic conversion is described below.

The amount of released gas in the TDS analysis is proportional to an integral value of a spectrum. Thus, from the ratio of the integral value of a spectrum of the insulating film to a reference value of a standard sample, the amount of released gas can be calculated. The reference value of a standard sample is the ratio of density of a predetermined atom contained in a sample to the integral value of a spectrum.

For example, the number of released oxygen molecules (N$_{O2}$) from an insulating film can be found according to Formula 1 with the TDS analysis results of a silicon wafer containing hydrogen at a predetermined density that is the standard sample and the TDS analysis results of the insulating film. Here, all the spectra having a mass number of 32 that are obtained by the TDS analysis are assumed to originate from an oxygen molecule. Note that CH$_3$OH, which is given as a gas having a mass number of 32, is not taken into consideration on the assumption that it is unlikely to be present. Further, an oxygen molecule including an oxygen atom having a mass number of 17 or 18 that is an isotope of an oxygen atom is not taken into consideration either because the proportion of such a molecule in the natural world is minimal.

$$N_{O2}=N_{H2}/S_{H2}\times S_{O2}\times \alpha \qquad \text{(Formula 1)}.$$

In the formula, N$_{H2}$ is the value obtained by conversion of the number of hydrogen molecules released from the standard sample into density, and S$_{H2}$ is the integral value of a spectrum of the standard sample which is analyzed by TDS. Here, the reference value of the standard sample is expressed by N$_{H2}$/S$_{H2}$. Further, S$_{O2}$ is the integral value of a spectrum of the insulating film which is analyzed by TDS, and α is a coefficient which influences spectrum intensity in the TDS analysis. Japanese Published Patent Application No. H6-275697 can be referred to for details of Formula 1. Note that the above value of the amount of oxygen released from the insulating film is obtained by measurement with a thermal desorption spectrometer produced by ESCO Ltd., EMD-WA1000S/W using a silicon wafer containing hydrogen atoms at $1\times10^{16}$ atoms/cm$^2$ as the standard sample.

Further, in the TDS, oxygen is partly detected as an oxygen atom. The ratio between oxygen molecules and oxygen atoms can be calculated from the ionization rate of oxygen molecules. Note that, since the above α is determined considering the ionization rate of oxygen molecules, the number of released oxygen atoms can be estimated through the evaluation of the number of the released oxygen molecules.

Note that N$_{O2}$ is the number of released oxygen molecules. In the insulating film, the amount of released oxygen when converted into oxygen atoms is twice the number of the released oxygen molecules.

By supplying oxygen from the base insulating film 103 to the oxide semiconductor film 105, an interface state between the base insulating film 103 and the oxide semiconductor film 105 can be reduced. As a result, electric charge or the like which may be generated due to an operation of the transistor or the like can be prevented from being trapped at the interface between the base insulating film 103 and the oxide semiconductor film 105; accordingly, a transistor with less variation in electric characteristics can be provided.

In other words, when oxygen vacancies are generated in the oxide semiconductor film 105, electric charge is trapped at the interface between the base insulating film 103 and the oxide semiconductor film 105, whereby the electric charge affects the electric characteristics of the transistor. However, by providing an insulating film from which oxygen is released by heating as the base insulating film 103, the interface state between the oxide semiconductor film 105 and the base insulating film 103 can be reduced, and an influence of the trap of electric charge at the interface between the oxide semiconductor film 105 and the base insulating film 103 can be made small.

Like the gate insulating film 109, the base insulating film 103 may be formed using an insulating film with high film density and few defects, typically an insulating film whose film density is higher than or equal to 2.26 g/cm$^3$ and lower than or equal to 2.63 g/cm$^3$ that is the theoretical value of film density, preferably higher than or equal to 2.30 g/cm$^3$ and lower than or equal to 2.63 g/cm$^3$ and whose spin density of a signal with a g value of 2.001 is $2\times10^{15}$ spins/cm$^3$ or less in electron spin resonance. Alternatively, the base insulating film 103 may have a stacked structure in which an insulating film with high film density and few defects which is similar to the gate insulating film 109 is provided on the oxide semiconductor film 105 side. Typically, the insulating film has a film density higher than or equal to 2.26 g/cm$^3$ and lower than or equal to 2.63 g/cm$^3$ and has a spin density of a signal with a g value of 2.001 is $2\times10^{15}$ spins/cm$^3$ or less, preferably the lower limit of detection ($1\times10^{15}$ spins/cm$^3$) or less in electron spin resonance. With the use of such an insulating film, a shift in the threshold voltage of the transistor can be reduced.

The oxide semiconductor film 105 can be formed in a manner similar to that of the oxide semiconductor film 19 in Embodiment 1.

The pair of electrodes 107 can be formed in a manner similar to that of the pair of electrodes 21 shown in Embodiment 1. Note that the length of the pair of electrodes 107 in the channel width direction is larger than that of the oxide semiconductor film 105, and seen in the cross section in the channel length direction, the pair of electrodes 107 covers end portions of the oxide semiconductor film 105. With such a structure, the area of contact between the pair of electrodes 107 and the oxide semiconductor film 105 is increased. Thus, the contact resistance between the oxide semiconductor film 105 and the pair of electrodes 107 can be reduced, and the on-state current of the transistor can be increased.

The gate electrode 111 can be formed in a manner similar to that of the gate electrode 15 in Embodiment 1. The insulating film 113 can be formed in a manner similar to that of the insulating film 23 in Embodiment 1.

The wirings 115 can be formed using a material that can be used for the pair of electrodes 107 as appropriate.

Next, a method for manufacturing the transistor illustrated in FIGS. 5A to 5C will be described with reference to FIGS. 6A to 6D.

Figure 6A:
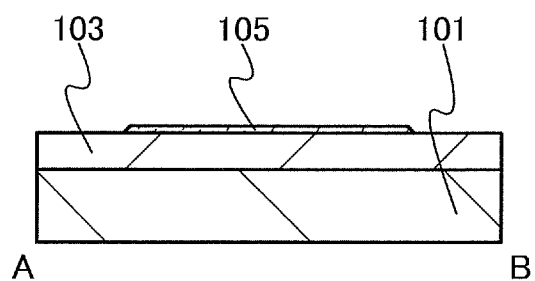
FIGS. 6A to 6D are cross-sectional views illustrating one embodiment of a method for manufacturing a transistor.

As illustrated in FIG. 6A, the base insulating film 103 is formed over the substrate 101. Next, the oxide semiconductor film 105 is formed over the base insulating film 103.

The base insulating film 103 is formed by a sputtering method, a CVD method, or the like.

When the oxide insulating film from which part of oxygen is released by heating is formed by a sputtering method as the base insulating film 103, the amount of oxygen in a deposition gas is preferably large, and oxygen, a mixed gas of oxygen and a rare gas, or the like can be used. Typically, the oxygen concentration in a deposition gas is preferably higher than or equal to 6% and lower than or equal to 100%.

In the case where an oxide insulating film is formed by a CVD method as the base insulating film 103, hydrogen or water derived from a source gas is sometimes mixed in the oxide insulating film. Thus, after the oxide insulating film is formed by a CVD method, heat treatment is preferably performed as dehydrogenation or dehydration.

In the case of adding oxygen to the oxide insulating film formed by a CVD method, the amount of oxygen released by heating can be increased. As the method for adding oxygen to the oxide insulating film, an ion implantation method, an ion doping method, a plasma immersion ion implantation method, plasma treatment, or the like can be used.

The oxide semiconductor film 105 can be formed as appropriate by a formation method similar to that of the oxide semiconductor film 19 described in Embodiment 1.

In order to improve the orientation of the crystal parts in the CAAC-OS film, planarity of the surface of the base insulating film 103 serving as a base insulating film of the oxide semiconductor film is preferably improved. Typically, the average surface roughness ($R_a$) of the base insulating film 103 is preferably 1 nm or less, further preferably 0.3 nm or less, still preferably 0.1 nm or less. In this specification and the like, average surface roughness ($R_a$) is obtained by three-dimensional expansion of arithmetic mean surface roughness that is defined by JIS B 0601:2001 (ISO4287:1997) so as to be applied to a curved surface, and is an average value of the absolute values of deviations from a reference surface to a specific surface. As planarization treatment, one or more can be selected from chemical mechanical polishing (CMP) treatment, dry etching treatment, plasma treatment (reverse sputtering), and the like. The plasma treatment is the one in which minute unevenness of the surface is reduced by introducing an inert gas such as an argon gas into a vacuum chamber and applying an electric field so that a surface to be processed serves as a cathode.

Next, heat treatment is preferably performed. By this heat treatment, part of oxygen contained in the base insulating film 103 can be diffused to the vicinity of the interface between the base insulating film 103 and the oxide semiconductor film 105. As a result, the interface state in the vicinity of the interface between the base insulating film 103 and the oxide semiconductor film 105 can be reduced.

The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed in an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferable that the above inert gas atmosphere and the above oxygen atmosphere do not contain hydrogen, water, and the like. The treatment time is 3 minutes to 24 hours.

Note that the oxide semiconductor film 105 may be formed in the following manner: an oxide semiconductor film that is to be the oxide semiconductor film 105 in a later step is formed over the base insulating film 103; heat treatment is performed thereon; and part of the oxide semiconductor film is etched. By the above steps, oxygen contained in the base insulating film 103 can be diffused more in the vicinity of the interface between the base insulating film 103 and the oxide semiconductor film 105.

Figure 6B:
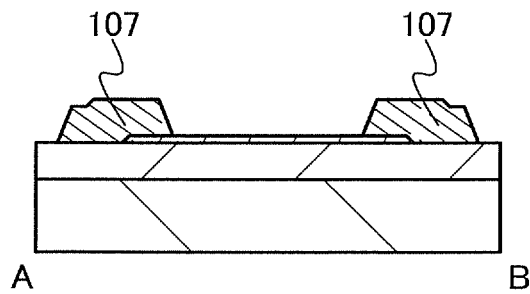

Next, as illustrated in FIG. 6B, the pair of electrodes 107 is formed. The pair of electrodes 107 can be formed as appropriate by a formation method similar to that of the pair of electrodes 21 described in Embodiment 1. Alternatively, the pair of electrodes 107 can be formed by a printing method or an inkjet method.

Figure 6C:
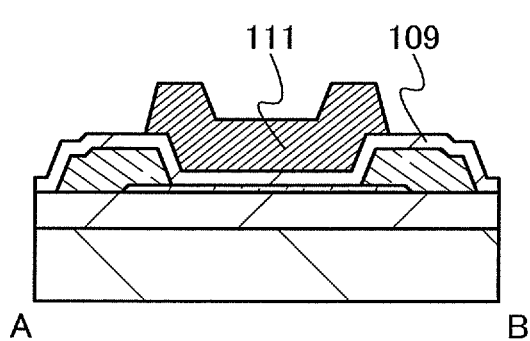

The gate insulating film 109 is formed, and then, the gate electrode 111 is formed over the gate insulating film 109 as illustrated in FIG. 6C.

The gate insulating film 109 is formed by a method similar to that for forming the gate insulating film 17 in Embodiment 1 as appropriate, whereby the gate insulating film 109 can be a silicon oxide film or a silicon oxynitride film with high film density and few defects.

In a CAAC-OS film, oxygen tends to move along the surface where the CAAC-OS film is formed or the surface of the CAAC-OS film. Thus, oxygen release occurs from the side surface of the oxide semiconductor film 105 that has been subjected to element isolation, and oxygen vacancies tend to be formed in the side surface. However, when as the gate insulating film 109, an oxide insulating film from which part of oxygen is released by heating and a metal oxide film (which is to be over the oxide insulating film) are formed over the oxide semiconductor film 105, oxygen release from the side surface of the oxide semiconductor film 105 can be suppressed.

As a result, an increase in conductivity of the side surface of the oxide semiconductor film 105 can be suppressed.

The gate electrode 111 can be formed as appropriate by a formation method similar to that of the gate electrode 15 in Embodiment 1.

Figure 6D:
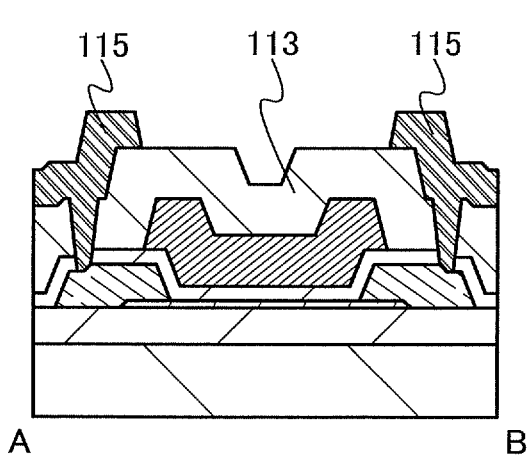

Next, the insulating film 113 is formed over the gate insulating film 109 and the gate electrode 111, and then the wirings 115 connected to the pair of electrodes 107 are formed as illustrated in FIG. 6D.

The insulating film 113 can be formed in a manner similar to that of the insulating film 23 in Embodiment 1.

Next, heat treatment is performed as in Embodiment 1. The heat treatment is performed typically at a temperature higher than or equal to 150° C. and lower than the strain point of the substrate, preferably higher than or equal to 250° C. and lower than or equal to 450° C., further preferably higher than or equal to 300° C. and lower than or equal to 450° C.

After a conductive film is formed by a sputtering method, a CVD method, an evaporation method, or the like, a mask is formed over the conductive film and the conductive film is etched, so that the wirings 115 are formed. The mask can be formed over the conductive film by a printing method, an inkjet method, or a photolithography method as appropriate. Then, the mask is removed. Alternatively, the wirings 115 may be formed by a dual damascene method.

Through the above process, a transistor having excellent electric characteristics in which a shift in threshold voltage and a variation in electric characteristics are small can be manufactured. In addition, a highly reliable transistor in which a variation in electric characteristics with time or a variation in electric characteristics due to a gate BT stress test with light irradiation is small can be manufactured.

Note that the structures, methods, and the like described in this embodiment can be used as appropriate in combination with any of the structures, methods, and the like described in the other embodiments and examples.

Embodiment 3

In this embodiment, a transistor having a different structure from the transistors in Embodiments 1 and 2 will be described with reference to FIGS. 7A and 7B. A transistor 120 described in this embodiment is different from the transistor 100 described in Embodiment 2 in that a gate electrode does not overlap with a pair of electrodes and a dopant is added to an oxide semiconductor film.

Figure 7A:
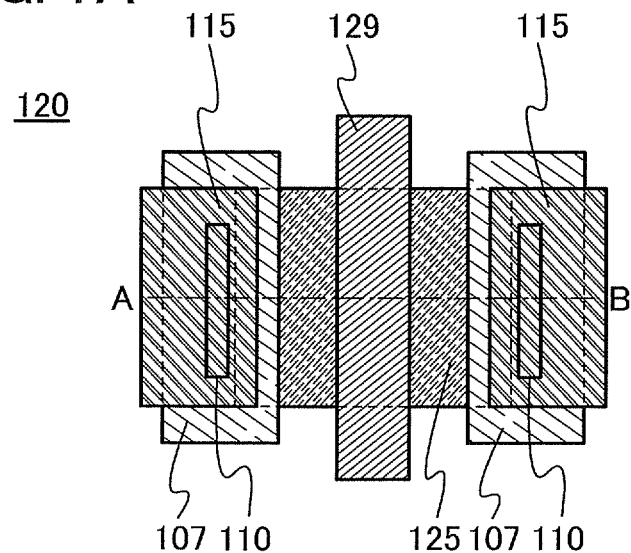
FIGS. 7A and 7B are a top view and a cross-sectional view illustrating one embodiment of a transistor.
Figure 7B:
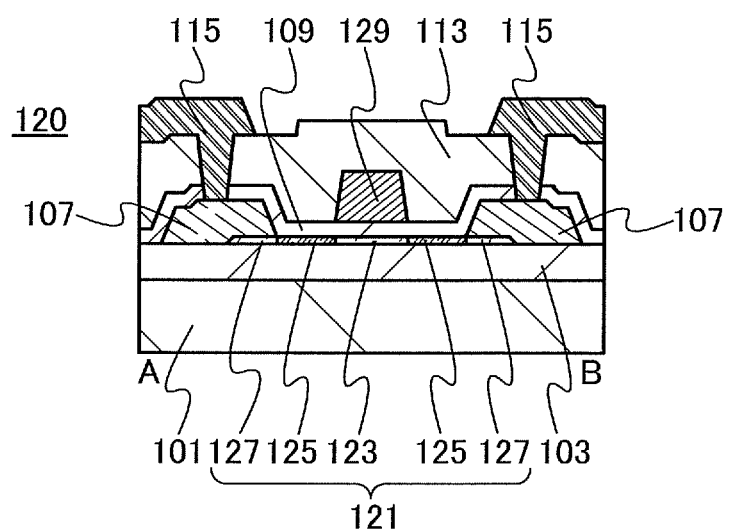

FIGS. 7A and 7B are a top view and a cross-sectional view of the transistor 120. FIG. 7A is a top view of the transistor 120, and FIG. 7B is a cross-sectional view taken along dashed line A-B in FIG. 7A. Note that in FIG. 7A, the substrate 101, the base insulating film 103, some components of the transistor 120 (e.g., the gate insulating film 109), the insulating film 113, and the like are not illustrated for simplicity.

The transistor 120 illustrated in FIG. 7B includes an oxide semiconductor film 121 over the base insulating film 103, the pair of electrodes 107 in contact with the oxide semiconductor film 121, the gate insulating film 109 in contact with the base insulating film 103, the oxide semiconductor film 121, and the pair of electrodes 107, and the gate electrode 129 overlapping with the oxide semiconductor film 121 with the gate insulating film 109 interposed therebetween. In addition, the insulating film 113 covering the gate insulating film 109 and the gate electrode 129 is provided. Furthermore, the wirings 115 may provided in contact with the pair of electrodes 107 through the openings 110 formed in the gate insulating film 109 and the insulating film 113 (see FIG. 7A).

In the transistor 120 in this embodiment, the oxide semiconductor film 121 includes a first region 123 overlapping with the gate electrode 129 with the gate insulating film 109 interposed therebetween, a pair of second regions 125 to which dopant is added, and a pair of third regions 127 in contact with the pair of electrodes 107. Note that dopant is not added to the first region 123 or the third regions 127. The pair of second regions 125 is provided such that the first region 123 is sandwiched therebetween. The pair of third regions 127 is provided so that the first region 123 and the second regions 125 are sandwiched therebetween.

The first region 123 functions as a channel region in the transistor 120. From a region in the third regions 127, which is in contact with the pair of electrodes 107, part of contained oxygen is diffused to the pair of electrodes 107, so that oxygen vacancies are caused, and accordingly such a region becomes an n-type region. Thus, parts of the third regions 127 function as a source region and a drain region. The second regions have high conductivity because dopant is added thereto, and thus function as a low resistance region which has a function of reducing resistance between the channel region and the source or drain region. Therefore, the on-state current and field-effect mobility of the transistor 120 can be increased.

As the dopant added to the second regions 125, at least one of boron, nitrogen, phosphorus, and arsenic can be given. Alternatively, at least one of helium, neon, argon, krypton, and xenon can be given. Still alternatively, dopant may contain at least one of boron, nitrogen, phosphorus, and arsenic and at least one of helium, neon, argon, krypton, and xenon in appropriate combination.

The dopant concentration of the pair of second regions 125 is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the dopant is included, the carrier density or defects in the second regions 125 can be increased. Therefore, the conductivity can be high as compared with the first region 123 and the third regions 127 which do not contain dopant. Note that when the dopant concentration is too high, the dopant inhibits carrier transfer, leading to lower conductivity of the second regions 125.

The conductivity of the second regions 125 is preferably higher than or equal to 0.1 S/cm and lower than or equal to 1000 S/cm, preferably higher than or equal to 10 S/cm and lower than or equal to 1000 S/cm.

Next, a method for manufacturing the transistor 120 shown in this embodiment will be described with reference to FIGS. 6A and 6B and FIGS. 7A and 7B.

As in Embodiment 2, the base insulating film 103 is formed over the substrate 101, the oxide semiconductor film 121 is formed over the base insulating film 103, and the pair of electrodes 107 is formed over the oxide semiconductor film 121 through the steps illustrated in FIGS. 6A and 6B. Then, the gate insulating film 109 is formed over the oxide semiconductor film 121 and the pair of electrodes 107. After that, the gate electrode 129 is formed so as to overlap with part of the oxide semiconductor film 121 with the gate insulating film 109 interposed therebetween.

Here, an example of a method for forming a gate electrode whose width is reduced to a length shorter than or equal to the resolution limit of a light exposure apparatus is described. A slimming process is preferably performed on a mask used for forming the gate electrode 129 to make the mask have a further miniaturized structure. As the slimming process, an ashing process using an oxygen radical or the like can be employed, for example. However, the slimming process other than the ashing process may be used as long as the mask formed by a photolithography method or the like can be processed to have a further miniaturized structure. Since the channel length of a transistor is determined by the mask formed by the slimming process, a process with high controllability is preferably employed. As a result of the slimming process, the width of the mask formed by a photolithography method or the like can be reduced to a length shorter than or equal to the resolution limit of a light exposure apparatus, preferably less than or equal to half of the resolution limit of a light exposure apparatus, and further preferably less than or equal to one third of the resolution limit of the light exposure apparatus. For example, the width of the formed mask can be greater than or equal to 20 nm and less than or equal to 2000 nm, preferably greater than or equal to 50 nm and less than or equal to 350 nm. Further, when a conductive film is etched while the mask subjected to slimming is made to recede, the gate electrode 129 whose width is reduced to a length shorter than or equal to the resolution limit of a light exposure apparatus can be formed.

Next, dopant is added to the oxide semiconductor film 121 with the use of the pair of electrodes 107 and the gate electrode 129 as masks. As a method of adding a dopant to the oxide semiconductor film 121, an ion doping method or an ion implantation method can be used.

In the embodiment describe here, the addition of the dopant to the oxide semiconductor film 121 is conducted in a state where the oxide semiconductor film 121 is covered with the gate insulating film 109 and the like; alternatively, the addition of the dopant may be conducted in a state where the oxide semiconductor film 121 is exposed.

Further, the addition of the dopant may also be conducted using a method other than injection methods, such as an ion doping method and an ion implantation method. For example, the dopant can be added in the following manner: plasma is generated in an atmosphere of gas containing an element to be added and plasma treatment is performed on the oxide semiconductor film 121. A dry etching apparatus, a plasma CVD apparatus, or the like can be used to generate the plasma.

Note that the dopant may be added while the substrate 101 is being heated.

Here, phosphorus is added to the oxide semiconductor film 121 by an ion implantation method.

After that, heat treatment is performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

By this heat treatment, the conductivity of the second regions 125 can be increased. Note that through the heat treatment, the first region 123, the second regions 125, and the third regions 127 become a polycrystalline structure, an amorphous structure, or a CAAC-OS.

After that, as in Embodiment 2, the insulating film 113 is formed, heat treatment is performed, and then the wirings 115 are formed. In this manner, the transistor 120 illustrated in FIGS. 7A and 7B can be formed.

Through the above process, a transistor having excellent electric characteristics in which a shift in threshold voltage and a variation in electric characteristics are small can be manufactured. In addition, a highly reliable transistor in which a variation in electric characteristics with time or a variation in electric characteristics due to a gate BT stress test with light irradiation is small can be manufactured.

Note that the structures, methods, and the like described in this embodiment can be used as appropriate in combination with any of the structures, methods, and the like described in the other embodiments and examples.

Embodiment 4

In this embodiment, a transistor having a different structure from the transistors in Embodiments 1 to 3 will be described with reference to FIGS. 8A and 8B. In a transistor 130 shown in this embodiment, a structure of an oxide semiconductor film is different from those of the transistors in the other embodiments. In the oxide semiconductor film of the transistor 130, an electric-field relaxation region is provided between a channel region and a source or drain region.

Figure 8A:
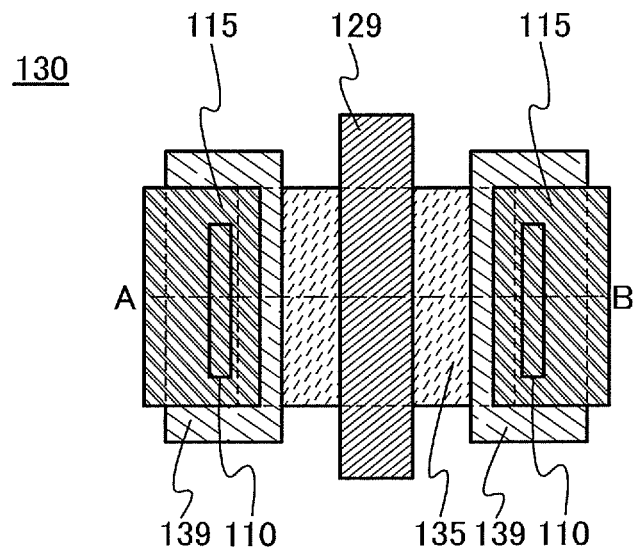
FIGS. 8A and 8B are a top view and a cross-sectional view illustrating one embodiment of a transistor.
Figure 8B:
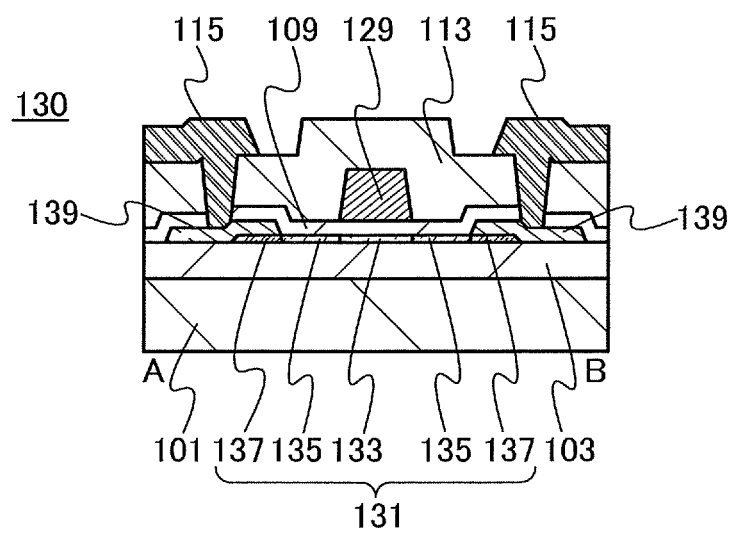

FIGS. 8A and 8B are a top view and a cross-sectional view of the transistor 130. FIG. 8A is a top view of the transistor 130, and FIG. 8B is a cross-sectional view taken along dashed-dotted line A-B in FIG. 8A. Note that in FIG. 8A, the substrate 101, the base insulating film 103, some components of the transistor 130 (e.g., the gate insulating film 109), the insulating film 113, and the like are not illustrated for simplicity.

The transistor 130 illustrated in FIG. 8B includes an oxide semiconductor film 131 over the base insulating film 103, a pair of electrodes 139 in contact with the oxide semiconductor film 131, the gate insulating film 109 in contact with the base insulating film 103, the oxide semiconductor film 131, and the pair of electrodes 139, and the gate electrode 129 overlapping with the oxide semiconductor film 131 with the gate insulating film 109 interposed therebetween. In addition, the insulating film 113 covering the gate insulating film 109 and the gate electrode 129 is provided. Furthermore, the wirings 115 may be provided in contact with the pair of electrodes 139 through the openings 110 formed in the gate insulating film 109 and the insulating film 113.

In the transistor 130 in this embodiment, the oxide semiconductor film 131 includes a first region 133 overlapping with the gate electrode with the gate insulating film 109 interposed therebetween, a pair of second regions 135 to which dopant is added, and a pair of third regions 137 which is in contact with the pair of electrodes 139 and to which dopant is added. Note that dopant is not added to the first region 133. The pair of second regions 135 is provided such that the first region 133 is sandwiched therebetween. The pair of third regions 137 is provided such that the first region 133 and the second regions 135 are sandwiched therebetween.

As the dopant added to the second regions 135 and the third regions 137, dopant similar to that added to the second regions 125 in Embodiment 3 can be used as appropriate.

The dopant concentration and the conductivity of the second regions 135 and the third regions 137 can be equal to those of the second regions 125 in Embodiment 3. Note that in this embodiment, the dopant concentration and the conductivity of the third regions 137 are higher than those of the second regions 135.

The first region 133 functions as a channel region in the transistor 130. The second regions 135 function as electric-field relaxation regions. From a region in the third regions 137, which is in contact with the pair of electrodes 139, part of contained oxygen is diffused to the pair of electrodes 139 depending on the material for the pair of electrodes 139, so that oxygen vacancies are caused, and accordingly such a region becomes an n-type region. Since the third regions 137 include the dopant and have high conductivity, the contact resistance between the third regions 137 and the pair of electrodes 139 can be reduced. Thus, the on-state current and the field-effect mobility of the transistor 130 can be increased.

In order to add the dopant to the third regions 137, the pair of electrodes 139 is preferably formed thin: the thickness is typically greater than or equal to 10 nm and less than or equal to 100 nm, preferably greater than or equal to 20 nm and less than or equal to 50 nm.

Next, a method for manufacturing the transistor 130 in this embodiment will be described with reference to FIGS. 6A and 6B and FIGS. 8A and 8B.

As in Embodiment 2, through the steps illustrated in FIGS. 6A and 6B, the base insulating film 103 is formed over the substrate 101, the oxide semiconductor film 131 is formed over the base insulating film 103, and the pair of electrodes 139 is formed over the oxide semiconductor film 131 (see FIG. 8B). Next, the gate insulating film 109 is formed over the oxide semiconductor film 131 and the pair of electrodes 139, and the gate electrode 129 is formed so as to overlap with part of the oxide semiconductor film 131 with the gate insulating film 109 interposed therebetween.

Next, the dopant is added to the oxide semiconductor film 131 with the use of the gate electrode 129 as a mask. The dopant can be added by a method similar to that described in Embodiment 3 as appropriate. Note that in this embodiment, dopant is added to the third regions 137 as well as the second regions 135. The dopant concentration in the third regions 137 is higher than that in the second regions 135. The conditions of the adding method are adjusted appropriately so that a peak of the dopant concentration profile appears in the third regions 137. In this case, the third regions 137 overlap with the pair of electrodes 139, but the second regions 135 do not overlap with the pair of electrodes 139. Accordingly, as for the dopant concentration profile of the second regions 135, a peak is positioned in the base insulating film 103; thus, the dopant concentration in the second regions 135 is lower than that in the third regions 137.

After that, heat treatment is performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

By the heat treatment, the conductivity of the second regions 135 and the third regions 137 can be increased. Note that through the heat treatment, the first region 133, the second regions 135, and the third regions 137 become a polycrystalline structure, an amorphous structure, or a CAAC-OS.

After that, as in Embodiment 2, the insulating film 113 is formed, heat treatment is performed, and then the wirings 115 are formed. In this manner, the transistor 130 illustrated in FIGS. 8A and 8B can be formed.

In the transistor 130 in this embodiment, the oxide semiconductor film 131 includes the first region 133 functioning as a channel region, and the second regions 135 functioning as an electric-field relaxation region between the third regions 137 functioning as a source region and a drain region. Thus, deterioration of the transistor can be suppressed in comparison with the transistor 100 in Embodiment 2. In addition, the third regions 137 in contact with the pair of electrodes 139 include the dopant, which enables the contact resistance between the pair of electrodes 139 and the third regions 137 to be further reduced. Accordingly, the on-state current of the transistor can be increased. A transistor having excellent characteristics in which a shift in threshold voltage and a variation in electric characteristics are small can be manufactured. In addition, a highly reliable transistor in which a variation in electric characteristics with time or a variation in electric characteristics due to a gate BT stress test with light irradiation is small can be manufactured.

Note that the structures, methods, and the like described in this embodiment can be used as appropriate in combination with any of the structures, methods, and the like described in the other embodiments and examples.

Embodiment 5

In this embodiment, a transistor having a different structure from the transistors in Embodiments 1 to 4 will be described with reference to FIGS. 9A and 9B.

Figure 9A:
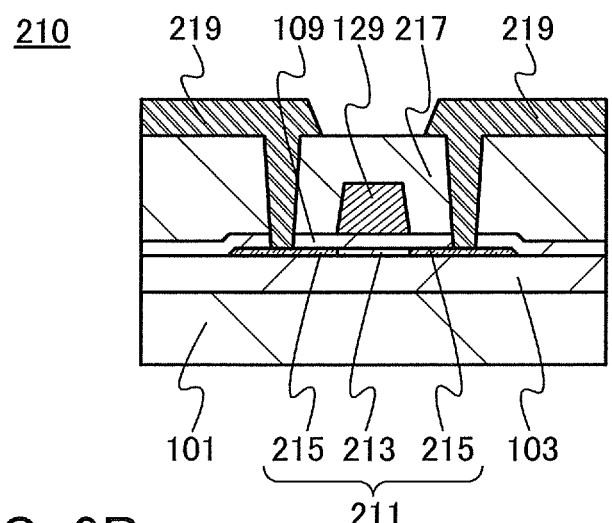
FIGS. 9A and 9B are cross-sectional views each illustrating one embodiment of a transistor.

A transistor 210 illustrated in FIG. 9A includes the base insulating film 103 over the substrate 101, an oxide semiconductor film 211 over the base insulating film 103, the gate insulating film 109 in contact with the base insulating film 103 and the oxide semiconductor film 211, and the gate electrode 129 overlapping with the oxide semiconductor film 211 with the gate insulating film 109 interposed therebetween. In addition, an insulating film 217 covering the gate insulating film 109 and the gate electrode 129 is provided, and wirings 219 are also provided in contact with the oxide semiconductor film 211 through openings formed in the gate insulating film 109 and the insulating film 217.

In the transistor 210 in this embodiment, the oxide semiconductor film 211 includes a first region 213 overlapping with the gate electrode 129 with the gate insulating film 109 interposed therebetween and a pair of second regions 215 to which dopant is added. Note that dopant is not added to the first region 213. Further, the pair of second regions 215 is provided such that the first region 213 is sandwiched therebetween.

The first region 213 functions as a channel region in the transistor 210. The second regions 215 function as a source region and a drain region.

The dopant similar to that added to the second regions 125 in Embodiment 3 can be used as appropriate for the dopant added to the second regions 215.

The dopant concentration and the conductivity of the second regions 215 can be equal to those of the second regions 125 in Embodiment 3.

Figure 9B:
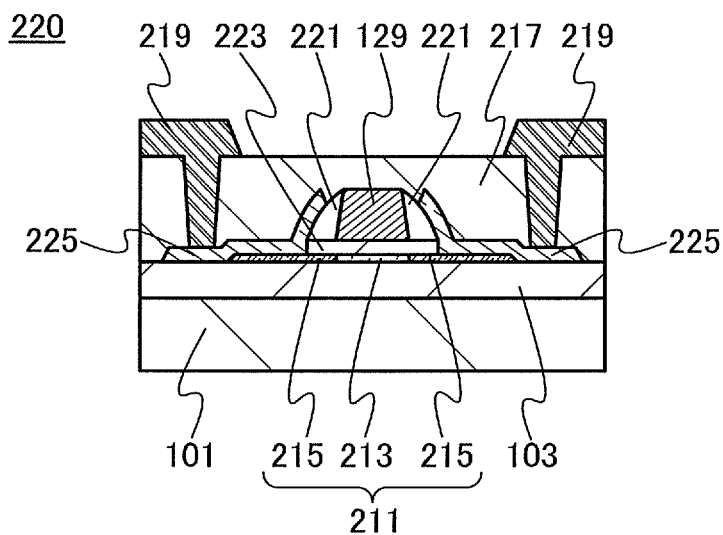

A transistor 220 illustrated in FIG. 9B includes the base insulating film 103 over the substrate 101, the oxide semiconductor film 211 over the base insulating film 103, a pair of electrodes 225 functioning as a source electrode and a drain electrode in contact with the oxide semiconductor film 211, a gate insulating film 223 in contact with at least part of the oxide semiconductor film 211, and the gate electrode 129 overlapping with the oxide semiconductor film 211, over the gate insulating film 223.

Further, the transistor includes sidewall insulating films 221 in contact with side surfaces of the gate electrode 129. Moreover, the insulating film 217 is provided over the base insulating film 103, the gate electrode 129, the sidewall insulating films 221, and the pair of electrodes 225. In addition, the wirings 219 are provided in contact with the pair of electrodes 225 though openings formed in the insulating film 217.

In the transistor in FIG. 9B, the oxide semiconductor film 211 includes the first region 213 overlapping with the gate electrode 129 with the gate insulating film 223 interposed therebetween and the pair of second regions 215 to which dopant is added. Note that dopant is not added to the first region 213. The pair of second regions 215 is provided such that the first region 213 is sandwiched therebetween.

End portions of the pair of electrodes 225 in the transistor are positioned over the sidewall insulating films 221, and the pair of electrodes 225 completely covers an exposed portion of the pair of second regions 215 including the dopant in the oxide semiconductor film 211. Thus, in the channel length direction, the distance between the source electrode and the drain electrode (more precisely, the distance in the oxide semiconductor film 211 between a portion in contact with one of the pair of electrodes 225 and a portion in contact with the other of the electrodes 225) can be controlled by the lengths of the sidewall insulating films 221. That is, in a minute device in which patterning using a mask is difficult, end portions on the channel side of the pair of electrodes 225 in contact with the oxide semiconductor film 211 can be formed without a mask. Further, because a mask is not used, variation among a plurality of transistors due to process can be reduced.

In the transistors 210 and 220 in this embodiment, the gate insulating films 109 and 223 are each an insulating film with high film density and few defects. As a result, a transistor having excellent electric characteristics in which a shift in threshold voltage and a variation in electric characteristics are small can be manufactured. In addition, a highly reliable transistor in which a variation in electric characteristics with time or a variation in electric characteristics due to a gate BT stress test with light irradiation is small can be manufactured.

Note that the structures, methods, and the like described in this embodiment can be used as appropriate in combination with any of the structures, methods, and the like described in the other embodiments and examples.

Embodiment 6

In this embodiment, a transistor having a different structure from the transistors in Embodiments 1 to 5 will be described with reference to FIG. 10. A transistor in this embodiment includes a plurality of gate electrodes facing each other with an oxide semiconductor film interposed therebetween. Note that in this embodiment, description is made using the transistor shown in Embodiment 2; however, this embodiment can be combined with any of the other embodiments as appropriate.

Figure 10:
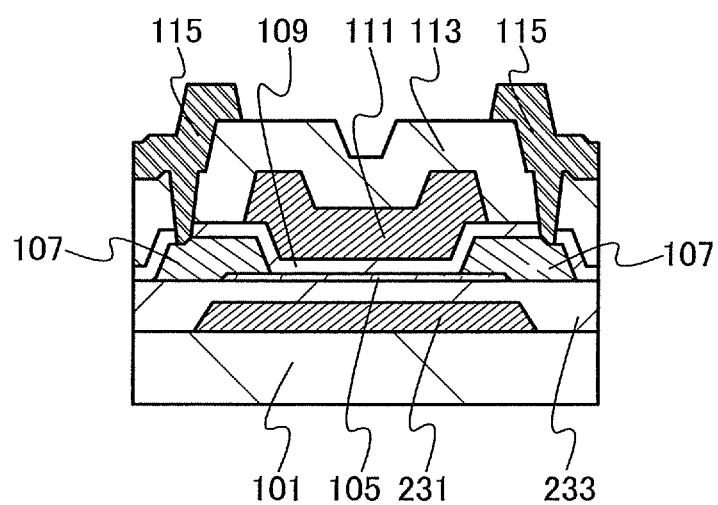
FIG. 10 is a cross-sectional view illustrating one embodiment of a transistor.

A transistor 230 illustrated in FIG. 10 includes a gate electrode 231 over the substrate 101 and an insulating film 233 covering the gate electrode 231. Further, the transistor includes the oxide semiconductor film 105 over the insulating film 233, the pair of electrodes 107 in contact with the oxide semiconductor film 105, the gate insulating film 109 in contact with the insulating film 233, the oxide semiconductor film 105, and the pair of electrodes 107, and the gate electrode 111 overlapping with the oxide semiconductor film 105 with the gate insulating film 109 interposed therebetween. In addition, the insulating film 113 covering the gate insulating film 109 and the gate electrode 111 is provided. Furthermore, the wirings 115 may be provided in contact with the pair of electrodes 107 through openings formed in the gate insulating film 109 and the insulating film 113.

The gate electrode 231 can be formed in a manner similar to that of the gate electrode 15 in Embodiment 1. The gate electrode 231 preferably has a tapered side surface in order to improve coverage with the insulating film 233 that is to be formed. The angle between the substrate 101 and the gate electrode 231 is greater than or equal to 20° and less than or equal to 70°, preferably greater than or equal to 30° and less than or equal to 60°.

The insulating film 233 can be formed in a manner similar to that of the base insulating film 103 in Embodiment 2. Note that the insulating film 233 preferably has a flat surface because the oxide semiconductor film 105 is formed over the insulating film 233 in a later step. Thus, an insulating film that is to be the insulating film 233 is formed over the substrate 101 and the gate electrode 231, and the insulating film is subjected to planarization treatment, so that the insulating film 233 with less surface unevenness is formed.

The transistor 230 in this embodiment has the gate electrode 231 and the gate electrode 111 facing each other with the oxide semiconductor film 105 interposed therebetween. By application of different potentials to the gate electrode 231 and the gate electrode 111, the threshold voltage of the transistor 230 can be controlled: preferably, the threshold voltage can be shifted in the positive direction.

In the transistor 230 in this embodiment, the gate insulating film 109 is an insulating film with high film density and few defects. As a result, a transistor having excellent electric characteristics in which a shift in threshold voltage and a variation in electric characteristics are small can be manufactured. In addition, a highly reliable transistor in which a variation in electric characteristics with time or a variation in electric characteristics due to a gate BT stress test with light irradiation is small can be manufactured.

Note that the structures, methods, and the like described in this embodiment can be used as appropriate in combination with any of the structures, methods, and the like described in the other embodiments and examples.

Embodiment 7

In this embodiment, a method for manufacturing a transistor in which the hydrogen concentration in an oxide semiconductor film is reduced will be described. Such a transistor is any of the transistors described in Embodiments 1 to 6. Here, description is made using Embodiments 1 and 2 typically; however, this embodiment can be combined with any of the other embodiments as appropriate. Note that at least one of steps described in this embodiment has to be combined with the process of manufacturing the transistor described in any of Embodiments 1 and 2; it is not necessary to combine all steps therewith.

In each of the oxide semiconductor film 19 in Embodiment 1 and the oxide semiconductor film 105 in Embodiment 2, the hydrogen concentration is lower than $5 \times 10^{18}$ atoms/cm$^3$, preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$.

Hydrogen contained in each of the oxide semiconductor films 19 and 105 reacts with oxygen bonded to a metal atom to produce water, and a defect is formed in a lattice from which oxygen is released (or a portion from which oxygen is released). In addition, a bond of hydrogen and oxygen causes generation of electrons serving as carrier. Thus, the impurities containing hydrogen are reduced as much as possible in the step of forming the oxide semiconductor film, whereby the hydrogen concentration in the oxide semiconductor film can be reduced. When an oxide semiconductor which is highly purified by removing hydrogen as much as possible is used as a channel region, a shift in threshold voltage in the negative direction can be reduced, and the leakage current between a source electrode and a drain electrode of the transistor (typically, the off-state current per channel width) can be decreased to several yA/μm to several zA/μm. As a result, electric characteristics of the transistor can be improved.

One of methods (a first method) of reducing the hydrogen concentration in the oxide semiconductor film 19 is as follows: before the oxide semiconductor film 19 is formed, hydrogen or water contained in each of the substrate 11, the base insulating film 13, the gate electrode 15, and the gate insulating film 17 is released by heat treatment or plasma treatment. As a result of this method, hydrogen or water attached to or contained in the substrate 11 to the gate insulating film 17 can be prevented from diffusing into the oxide semiconductor film 19 by performing heat treatment in a later step. The heat treatment is performed at a temperature higher than or equal to 100° C. and lower than the strain point of the substrate in an inert atmosphere, a reduced-pressure atmosphere, or a dry air atmosphere. Further, for the plasma treatment, rare gas, oxygen, nitrogen, or nitrogen oxide (e.g., nitrous oxide, nitrogen monoxide, or nitrogen dioxide) is used. Note that in Embodiments 2 to 6, before the oxide semiconductor film 105 is formed, hydrogen or water contained in each of the substrate 101 and the base insulating film 103 is released by heat treatment or plasma treatment.

Another method (a second method) of reducing the hydrogen concentration in the oxide semiconductor films 19 and 105 is as follows: before the oxide semiconductor film is formed with a sputtering apparatus, a dummy substrate is put into the sputtering apparatus, and an oxide semiconductor film is formed over the dummy substrate, so that hydrogen, water, and the like attached to the target surface or a deposition shield are removed. As a result, entry of hydrogen, water, or the like into the oxide semiconductor film can be reduced.

Another method (a third method) of reducing the hydrogen concentration in the oxide semiconductor films 19 and 105 is as follows: in the case where an oxide semiconductor film is formed by a sputtering method, for example, an oxide semiconductor film is deposited at a substrate temperature higher than or equal to 150° C. and lower than or equal to 750° C., preferably higher than or equal to 150° C. and lower than or equal to 450° C., further preferably higher than or equal to 200° C. and lower than or equal to 350° C. As a result of this method, entry of hydrogen, water, or the like into the oxide semiconductor film can be reduced.

Here, a sputtering apparatus with which the oxide semiconductor films 19 and 105 can be formed to have a low hydrogen concentration is described in detail below.

The leakage rate of a process chamber in which the oxide semiconductor film is formed is preferably lower than or equal to $1 \times 10^{-10}$ Pa·m³/sec, whereby entry of hydrogen, water, or the like into the film to be formed by a sputtering method can be reduced.

Evacuation of the process chamber in the sputtering apparatus is preferably performed with a rough vacuum pump such as a dry pump and a high vacuum pump such as a sputter ion pump, a turbo molecular pump, or a cryopump in appropriate combination. The turbo molecular pump has an outstanding capability in evacuating a large-sized molecule, whereas it has a low capability in evacuating hydrogen and water. Further, a combination with a sputter ion pump having a high capability in evacuating hydrogen or a cryopump having a high capability in evacuating water is effective.

An adsorbate present at the inner wall of the process chamber does not affect the pressure in the process chamber because it is adsorbed on the inner wall, but the adsorbate leads to release of a gas at the time of the evacuation of the process chamber. Therefore, although the leakage rate and the evacuation rate do not have a correlation, it is important that the adsorbate present in the process chamber be desorbed as much as possible and evacuation be performed in advance with the use of a pump having high evacuation capability. Note that the process chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

As described above, in the process for forming the oxide semiconductor film, entry of impurities is suppressed as much as possible through control of the pressure of the process chamber, leakage rate of the process chamber, and the like, whereby entry of hydrogen, water, or the like into the oxide semiconductor film can be reduced.

Another method (a fourth method) of reducing the hydrogen concentration in the oxide semiconductor films 19 and 105 is as follows: a high-purity gas from which an impurity containing hydrogen is removed is used as a source gas. As a result of this method, entry of hydrogen, water, or the like into the oxide semiconductor film can be reduced.

Another method (a fifth method) of reducing the hydrogen concentration in the oxide semiconductor films 19 and 105 is as follows: heat treatment is performed after the oxide semiconductor film is formed. By the heat treatment, dehydrogenation or dehydration of the oxide semiconductor film can be performed.

The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed in an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferable that the above inert gas atmosphere and the above oxygen atmosphere do not contain hydrogen, water, and the like. The treatment time is 3 minutes to 24 hours.

After the oxide semiconductor films 19 and 105 which have been subjected to element isolation are formed as illustrated in FIG. 2B and FIG. 6A, the heat treatment for dehydration or dehydrogenation may be performed. Through the above step, hydrogen, water, or the like included in the gate insulating film 17 or the base insulating film 103 can be efficiently released in the heat treatment for dehydration or dehydrogenation.

The heat treatment for dehydration or dehydrogenation may be performed plural times, and may also serve as another heat treatment.

At least one of the first to fifth methods of reducing the hydrogen concentration in the oxide semiconductor film is combined with any of the methods for manufacturing a transistor described in Embodiments 1 to 6, which makes it possible to manufacture a transistor in which a highly purified oxide semiconductor film from which hydrogen, water, or the like is removed as much as possible is used for a channel region. As a result, a shift in the threshold voltage of the transistor in the negative direction can be reduced, and the leakage current between a source electrode and a drain electrode of the transistor (typically, the off-state current per channel width) can be decreased to several yA/μm to several zA/μm. Thus, electric characteristics of the transistor can be improved. According to the description of this embodiment, a transistor having excellent electric characteristics in which a shift in the threshold voltage of the transistor in the negative direction is reduced and the amount of leakage current is small can be manufactured.

Embodiment 8

In this embodiment, a semiconductor device which includes a transistor formed using a first semiconductor material in a lower portion and a transistor formed using a second semiconductor material in an upper portion and in which the transistor formed using the first semiconductor material includes a semiconductor substrate will be described with reference to FIG. 11.

Figure 11:
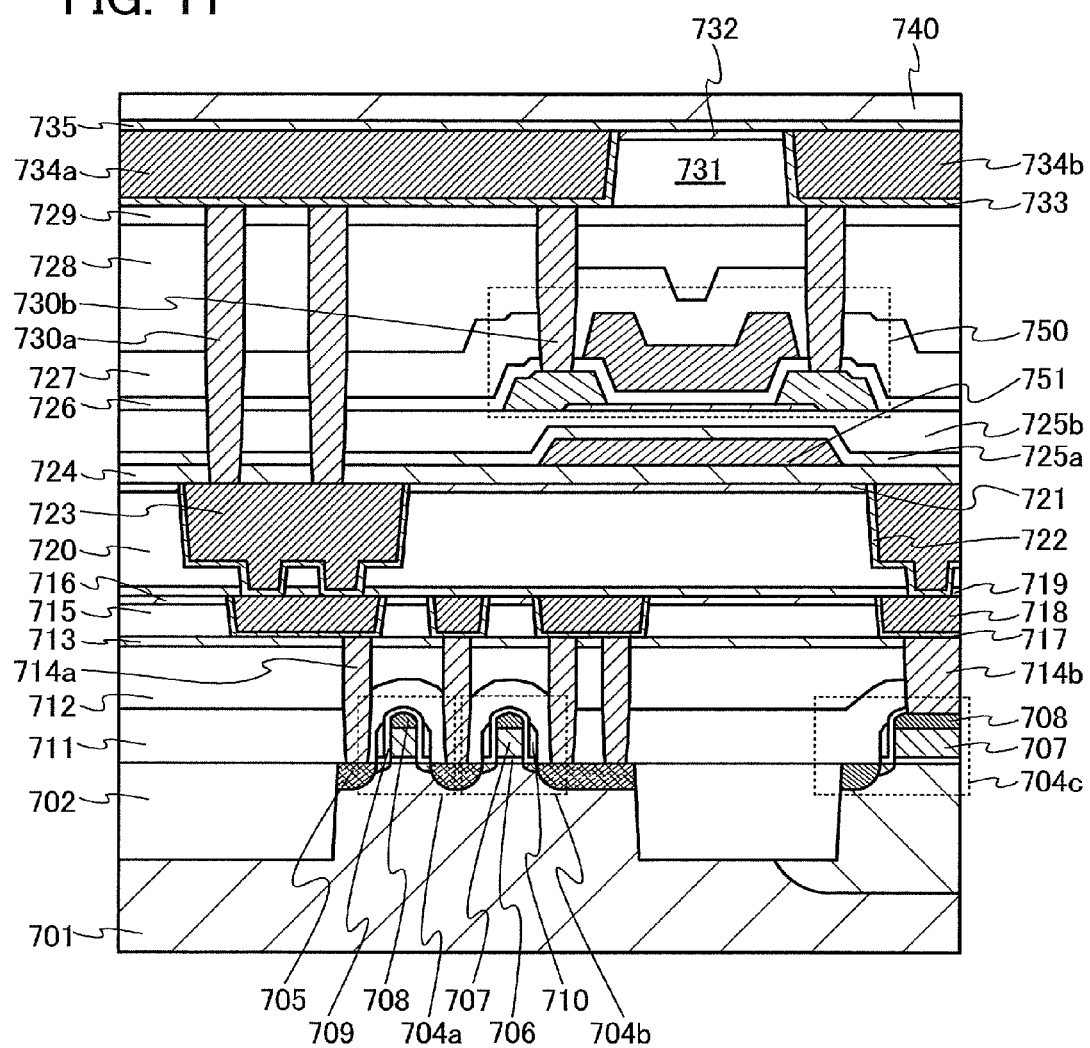
FIG. 11 is a cross-sectional view illustrating one embodiment of a semiconductor device.

FIG. 11 illustrates an example of a cross-sectional structure of the semiconductor device which includes the transistor formed using the first semiconductor material in the lower portion and the transistor formed using the second semiconductor material in the upper portion. Here, the first semiconductor material and the second semiconductor material are different from each other. For example, a semiconductor material other than an oxide semiconductor can be used as the first semiconductor material, and an oxide semiconductor can be used as the second semiconductor material. The semiconductor material other than an oxide semiconductor may be, for example, silicon, germanium, silicon germanium, silicon carbide, gallium arsenide, or the like and is preferably a single crystal semiconductor or a polycrystalline semiconductor. A transistor formed using single crystal semiconductor can operate at high speed easily. In contrast, a transistor formed using an oxide semiconductor can be used for a circuit utilizing characteristics of sufficiently low off-state current per channel width, which is approximately several yA/μm to several zA/μm. Thus, a logic circuit with low power consumption can be formed using the semiconductor device illustrated in FIG. 11. Alternatively, an organic semiconductor material or the like may be used as the first semiconductor material.

Either an n-channel transistor (NMOSFET) or a p-channel transistor (PMOSFET) can be used as each of transistors 704a, 704b, and 704c. Here, as the transistors 704a and 704b, p-channel transistors are used, and as the transistor 704c, an n-channel transistor is used. In the example illustrated in FIG. 11, the transistors 704a and 704b are electrically isolated from other elements by a shallow trench isolation (STI) 702. On the other hand, the transistor 704c is electrically isolated from the transistors 704a and 704b by the STI 702. The use of the STI 702 can reduce the generation of a bird's beak in an element isolation region, which is caused in an LOCOS element isolation method, and can reduce the size of the element isolation region. On the other hand, in a semiconductor device in which a transistor is not required to be structurally miniaturized, the STI 702 is not necessarily formed, and an element isolation means such as LOCOS can be used.

The transistors 704a, 704b, and 704c in FIG. 11 each include a channel region provided in a substrate 701, impurity regions 705 (also referred to as a source region and a drain region) provided such that the channel formation region is interposed therebetween, a gate insulating film 706 provided over the channel region, and gate electrodes 707 and 708 provided over the gate insulating film 706 so as to overlap with the channel region. A gate electrode can have, but is not limited to, a stacked structure of the gate electrode 707 including a first material for increasing processing accuracy and the gate electrode 708 including a second material for decreasing the resistance as a wiring; the material, the number of stacked layers, the shape, or the like can be adjusted as appropriate for required specifications. Note that a transistor whose source electrode and drain electrode are not illustrated in a drawing may also be referred to as a transistor for the sake of convenience.

Further, contact plugs 714a are connected to the impurity regions 705 provided in the substrate 701. Here, the contact plugs 714a also function as a source electrode and a drain electrode of the transistor 704a or the like. In addition, impurity regions which are different from the impurity regions 705 are provided between the impurity regions 705 and the channel region. The impurity regions function as LDD regions or extension regions for controlling the distribution of an electric field in the vicinity of the channel region, depending on the concentration of an impurity introduced thereto. Sidewall insulating films 710 are provided at side surfaces of the gate electrodes 707 and 708 with an insulating film 709 interposed therebetween. By using the insulating film 709 and the sidewall insulating films 710, the LDD regions or extension regions can be formed.

The transistors 704a, 704b, and 704c are covered with an insulating film 711. The insulating film 711 can function as a protective film and can prevent impurities from entering the channel region from the outside. In addition, when the insulating film 711 is formed using a material such as silicon nitride by a CVD method, in the case where single crystal silicon is used for the channel region, hydrogenation of single crystal silicon can be performed by heat treatment. When an insulating film having tensile stress or compressive stress is used as the insulating film 711, distortion can be caused in the semiconductor material in the channel region. By subjecting a silicon material in the channel region to tensile stress in the case of an n-channel transistor or subjecting a silicon material in the channel region to compressive stress in the case of a p-channel transistor, the mobility of the transistor can be improved.

Here, the transistor 750 in FIG. 11 has a structure similar to that of the transistor 100 in Embodiment 2. A base insulating film of the transistor 750 has a three-layer structure including a barrier film 724, an insulating film 725a, and an insulating film 725b, and a gate electrode 751 is provided to face an oxide semiconductor film of the transistor 750 with the base insulating film interposed therebetween. The insulating film 725a is preferably formed using an insulating film having a function of blocking hydrogen, water, and oxygen which is typically an aluminum oxide film. For the insulating film 725b, the base insulating film 103 in Embodiment 2 can be used as appropriate.

Although the transistor 100 in Embodiment 2 is used for description of the transistor 750, any of the transistors in Embodiments 1 to 7 can be used as appropriate.

The transistor 750 formed using the second semiconductor material is electrically connected to a transistor formed using the first semiconductor material in a lower layer, such as the transistor 704a, depending on a needed circuit configuration. FIG. 11 illustrates an example structure in which a source electrode or a drain electrode of the transistor 750 is electrically connected to a source electrode or a drain electrode of the transistor 704a.

One of the source electrode and the drain electrode of the transistor 750 formed using the second semiconductor material is connected to a wiring 734a formed above the transistor 750, through a contact plug 730b penetrating a gate insulating film 726 of the transistor 750 and insulating films 727, 728, and 729. For the gate insulating film 726 and the insulating film 727, any of the structures and materials described in Embodiments 1 to 7 can be used as appropriate.

The wiring 734a is embedded in an insulating film 731. For the wiring 734a, it is preferable to use a low-resistance conductive material such as copper or aluminum. By using a low-resistance conductive material, RC delay of signals transmitted through the wiring 734a can be reduced. In the case of using copper for the wiring 734a, a barrier film 733 is formed in order to prevent copper from diffusing into the channel region. The barrier film can be formed using a film of tantalum nitride, a stacked film of tantalum nitride and tantalum, a film of titanium nitride, a stacked film of titanium nitride and titanium, or the like for example, but are not limited to the films of these materials as long as their function of preventing diffusion of a wiring material and their adhesion to the wiring material, a base film, or the like are secured. The barrier film 733 may be formed as a layer that is separate from the wiring 734a, or may be formed in such a manner that a barrier film material contained in a wiring material is separated out by heat treatment to the inner walls of the openings provided in the insulating film 731.

For the insulating film 731, it is possible to use an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide made from $Si(OC_2H_5)_4$, hydrogen silsesquioxane (HSQ), methyl silsesquioxane (MSQ), organosilicate glass (OSG), or an organic-polymer-based material. In particular, in the case of advancing miniaturization of the semiconductor device, parasitic capacitance between wirings is significant and signal delay is increased. Therefore, the relative permittivity of silicon oxide (k=4.0 to 4.5) is too high, and it is preferable to use a material with k=3.0 or less. In addition, since CMP treatment is performed after the wiring is embedded in the insulating film, the insulating film needs to have high mechanical strength. As long as its mechanical strength can be secured, the insulating film can be made porous to have a lower dielectric constant. The insulating film 731 is formed by a sputtering method, a CVD method, a coating method including a spin coating method (also referred to as spin on glass (SOG)), or the like.

An insulating film 732 may be provided over the insulating film 731. The insulating film 732 functions as an etching stopper when planarization treatment by CMP or the like is performed after the wiring material is embedded in the insulating film 731.

Over the wiring 734a, a barrier film 735 is provided, and over the barrier film 735, a protective film 740 is provided. The barrier film 735 is provided in order to prevent diffusion of the wiring material such as copper. The barrier film 735 may be formed not only over a surface of the wiring 734a but also over the insulating films 731 and 732. The barrier film 735 can be formed using an insulating material such as silicon nitride, SiC, or SiBON.

The wiring 734a is connected to a wiring 723 provided in a lower layer than the barrier film 724 through a contact plug 730a. The contact plug 730a is electrically connected to the wiring 723 through the barrier film 724, the insulating films 725a and 725b, the gate insulating film 726, and the insulating films 727, 728, and 729, which is different from the contact plug 730b. Thus, the contact plug 730a has a larger height than the contact plug 730b. In the case where the diameter of the contact plug 730a is the same as that of the contact plug 730b, the aspect ratio of the contact plug 730a is larger than that of the contact plug 730b. The diameter of the contact plug 730a may be different from that of the contact plug 730b. The contact plug 730a is illustrated like a continuous plug formed using one material; however, a contact plug penetrating the barrier film 724 and the insulating films 725a and 725b and a contact plug penetrating the gate insulating film 726 and the insulating films 727, 728, and 729 may be separately formed.

The wiring 723 is surrounded by a barrier film 722 and the barrier film 724 and embedded in the insulating film 720, in a manner similar to that of the wiring 734a and a wiring 734b. As illustrated in FIG. 11, the wiring 723 includes an upper wiring portion and a lower via hole portion. The lower via hole portion is connected to a wiring 718 in a lower layer. The wiring 723 having this structure can be formed by a so-called dual damascene method or the like. Wirings in upper and lower layers may be connected using a contact plug instead of the dual damascene method. An insulating film 721 functioning as an etching stopper when planarization treatment such as CMP is performed may be provided over the insulating film 720.

The wiring 718 electrically connected to the wiring 723 can also be formed to have a structure similar to that of the above-described wiring layer above the transistor 750. The transistor 704a in which the first semiconductor material such as silicon is used for the channel region is connected to the wiring 718 through the contact plug 714a penetrating the insulating film 711, an insulating film 712, and an insulating film 713. A gate electrode of the transistor 704c in which the first semiconductor material such as silicon is used for the channel region is connected to the wiring 718 through a contact plug 714b penetrating the insulating film 711, the insulating film 712, and the insulating film 713. The wiring 718 is surrounded by barrier films 717 and 719 and embedded in an insulating film 715, in a manner similar to that of the wirings 734a and 734b. Over the insulating film 715, an insulating film 716 functioning as an etching stopper when planarization treatment such as CMP is performed may be provided.

As described above, through a plurality of contact plugs and a plurality of wirings, the transistor 704a, which includes the first semiconductor material and is provided in the lower portion of the semiconductor device, is electrically connected to the transistor 750, which includes the second semiconductor material and is provided in the upper portion of the semiconductor device. With the above-described structure in which the transistor including the first semiconductor material and being capable of operating at high speed and the transistor including the second semiconductor material and having significantly small off-state current are combined, a semiconductor device including a logic circuit capable of operating at high speed with low power consumption, e.g., a memory device or a central processing unit (CPU), can be manufactured.

Such a semiconductor device is not limited to the above structure and can be changed as desired unless they deviate from the spirit of the present invention. For example, in the above description, two wiring layers are provided between the transistor including the first semiconductor material and the transistor including the second semiconductor material, but one wiring layer or three or more wiring layers may be provided, or without wirings, the transistors may be directly connected through only a contact plug. In this case, a through-silicon via (TSV) technique can also be used, for example. In addition, in the above description, a material such as copper is embedded in an insulating film to form a wiring, but a wiring having a three-layer structure of a barrier film, a wiring material layer, and a barrier film, for example, may be obtained by patterning through a photolithography step.

In the case where a copper wiring is formed in a tier between the transistors 704a and 704b including the first semiconductor material and the transistor 750 including the second semiconductor material, it is particularly necessary to take into consideration the influence of heat treatment performed in the process for manufacturing the transistor 750 including the second semiconductor material. In other words, it is necessary to take care that the temperature of heat treatment performed in the process for manufacturing the transistor 750 including the second semiconductor material is appropriate to the properties of the wiring material. This is because, in the case where high-temperature heat treatment is performed on a component of the transistor 750 for example, thermal stress is caused in the case of using the copper wiring, leading to a problem such as stress migration.

Here, one embodiment of a logic circuit included in the semiconductor device in FIG. 11 in this embodiment will be described with reference to FIGS. 12A and 12B. As one embodiment of the logic circuit, a NOR circuit and a NAND circuit are used here.

Figure 12A:
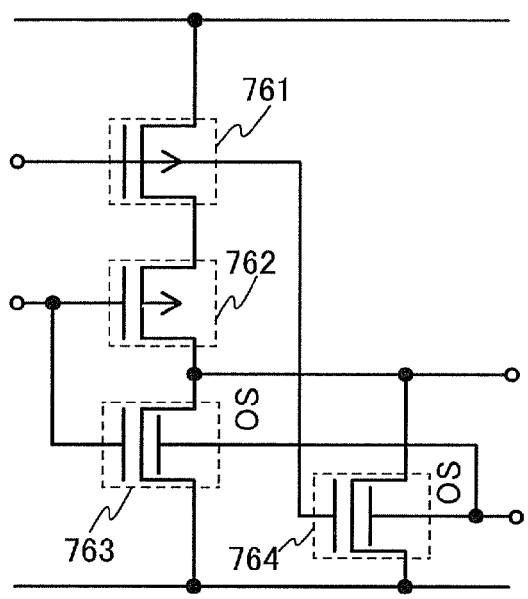
FIGS. 12A and 12B are circuit diagrams each illustrating one embodiment of a semiconductor device.
Figure 12B:
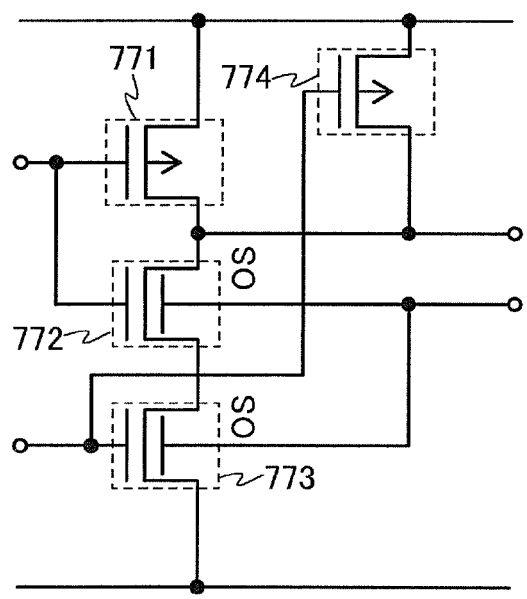

FIG. 12A is a circuit diagram of a NOR circuit, and FIG. 12B is a circuit diagram of a NAND circuit.

In the NOR circuit illustrated in FIG. 12A, a transistor 761 and a transistor 762 are p-channel transistors. A transistor 763 and a transistor 764 are n-channel transistors. As the transistor 763 and the transistor 764, any of the transistors described in the above embodiments can be used.

In the NAND circuit illustrated in FIG. 12B, a transistor 771 and a transistor 774 are p-channel transistors. A transistor 772 and a transistor 773 are n-channel transistors. As the transistor 772 and the transistor 773, any of the transistors described in the above embodiments can be used. Note that "OS" in FIGS. 12A and 12B shows that any of the transistors described in the above embodiments can be used as the transistor 763, the transistor 764, the transistor 772, and the transistor 773.

In the NOR circuit and the NAND circuit in FIGS. 12A and 12B, the transistor 750 including the plurality of gate electrodes between which the oxide semiconductor film is sandwiched in FIG. 11 can also be used as the transistor 763, the transistor 764, the transistor 772, and the transistor 773. With such a structure, different potentials can be applied to a plurality of gate electrodes; thus, the threshold voltage of the transistor can be controlled, preferably the threshold voltage can be positively shifted. Alternatively, when the same potential is applied to the plurality of gate electrodes, the on-state current of the transistor can be increased.

Here, a cross-sectional structure of the NAND circuit in FIG. 12A will be described with reference to FIG. 11. The transistor 761 and the transistor 762 in FIG. 12A correspond to the transistor 704a and the transistor 704b in FIG. 11. The transistor 763 in FIG. 12A corresponds to the transistor 750 in FIG. 11. Note that the transistor 764 and a connection portion of gate electrodes of the transistor 762 and the transistor 763 in FIG. 12A are not illustrated in FIG. 11.

With the use of an insulating film with high film density and few defects for gate insulating films of the transistors 750, 763, 764, 772, and 773 in this embodiment, a transistor with excellent electric characteristics in which a shift in threshold voltage and a variation in electric characteristics are small can be manufactured. In addition, a highly reliable semiconductor device in which a variation in electric characteristics with time or a variation in electric characteristics due to a gate BT stress test with light irradiation is small can be manufactured.

Note that the structures, methods, and the like described in this embodiment can be used as appropriate in combination with any of the structures, methods, and the like described in the other embodiments and examples.

Embodiment 9

As examples of the semiconductor device described in any of the above embodiments, a central processing unit, a microprocessor, a microcomputer, a memory device, an image sensor, an electro-optical device, a light-emitting display device, and the like can be given. The semiconductor device can be applied to a variety of electronic devices. Examples of the electronic devices are as follows: display devices, lighting devices, personal computers, word processors, image reproducing devices, portable compact disc (CD) players, radio receivers, tape recorders, headphone stereos, stereos, clocks, cordless phone handsets, transceivers, portable wireless devices, cellular phones, smart phones, electronic books, car phones, portable game machines, calculators, portable information terminals, e-book readers, electronic translators, audio input devices, cameras such as video cameras or digital still cameras, electric shavers, high-frequency heating appliances, electric rice cookers, electric washing machines, electric vacuum cleaners, water heaters, electric fans, hair dryers, air conditioners, humidifiers, dehumidifiers, air-conditioning systems, dishwashing machines, dish drying machines, clothes dryers, futon dryers, electric refrigerators, electric freezers, electric refrigerator-freezers, freezers for preserving DNA, flashlights, electric power tools, smoke detectors, medical equipments, guide lights, traffic lights, belt conveyors, elevators, escalators, industrial robots, power storage systems, electric vehicles, hybrid electric vehicles, plug-in hybrid electric vehicles, tracked vehicles, motorized bicycles, motorcycles, electric wheelchairs, golf carts, boats, ships, submarines, helicopters, aircrafts, rockets, artificial satellites, space probes, planetary probes, and spacecrafts. In this embodiment, examples of application of the semiconductor device described in any of the above embodiments to portable devices such as cellular phones, smartphones, or e-book readers will be described with reference to FIGS. 13A and 13B, FIG. 14, FIG. 15, and FIG. 16.

In portable electronic devices such as a cellular phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 13A:
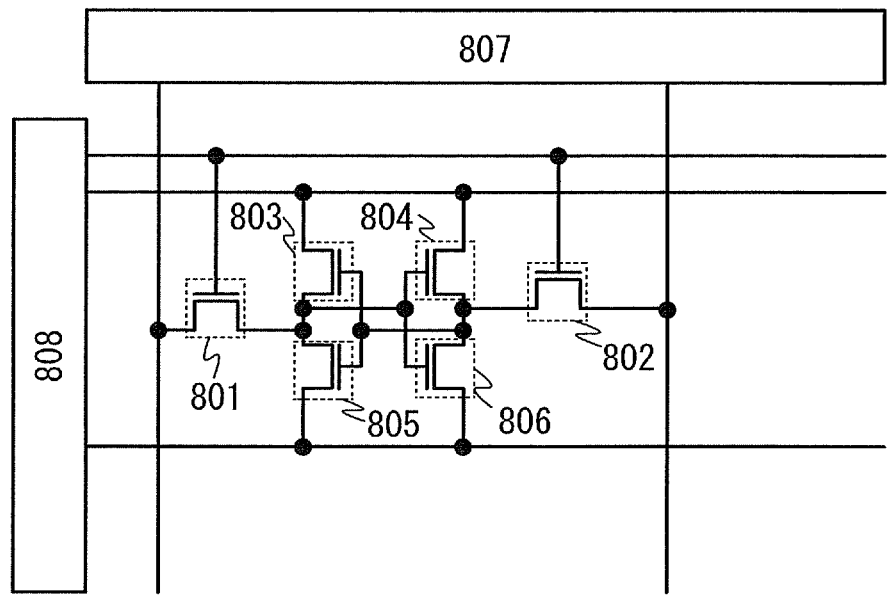
FIGS. 13A and 13B are circuit diagrams each illustrating one embodiment of a semiconductor device.

In an ordinary SRAM, as illustrated in FIG. 13A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 13B:
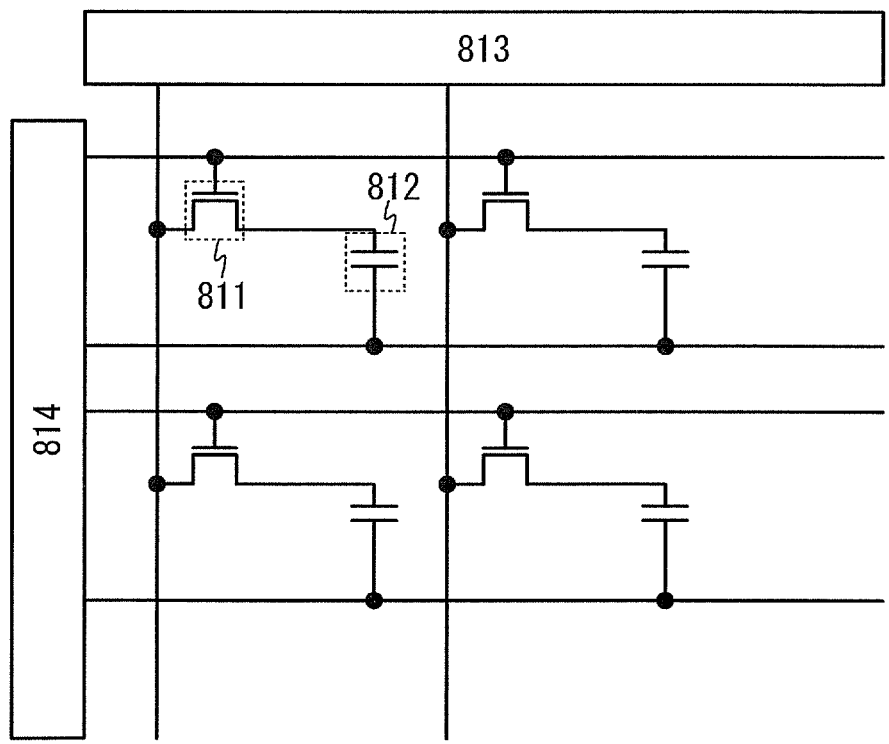

On the other hand, as illustrated in FIG. 13B, a memory cell in a DRAM includes a transistor 811 and a storage capacitor 812, and is driven by an X decoder 813 and a Y decoder 814. One cell includes one transistor and one capacitor and has a small area. The area of a memory cell of a DRAM is generally less than or equal to 10 $F^2$. Note that in the case of a DRAM, a refresh operation is always necessary and power is consumed even when a rewriting operation is not performed.

However, with the use of the transistor with low off-state current, which is described in the above embodiment, for the transistor 811, electric charge in the storage capacitor 812 can be held for a long time, and thus it is not necessary to perform refresh operation frequently. Accordingly, power consumption can be reduced.

Figure 14:
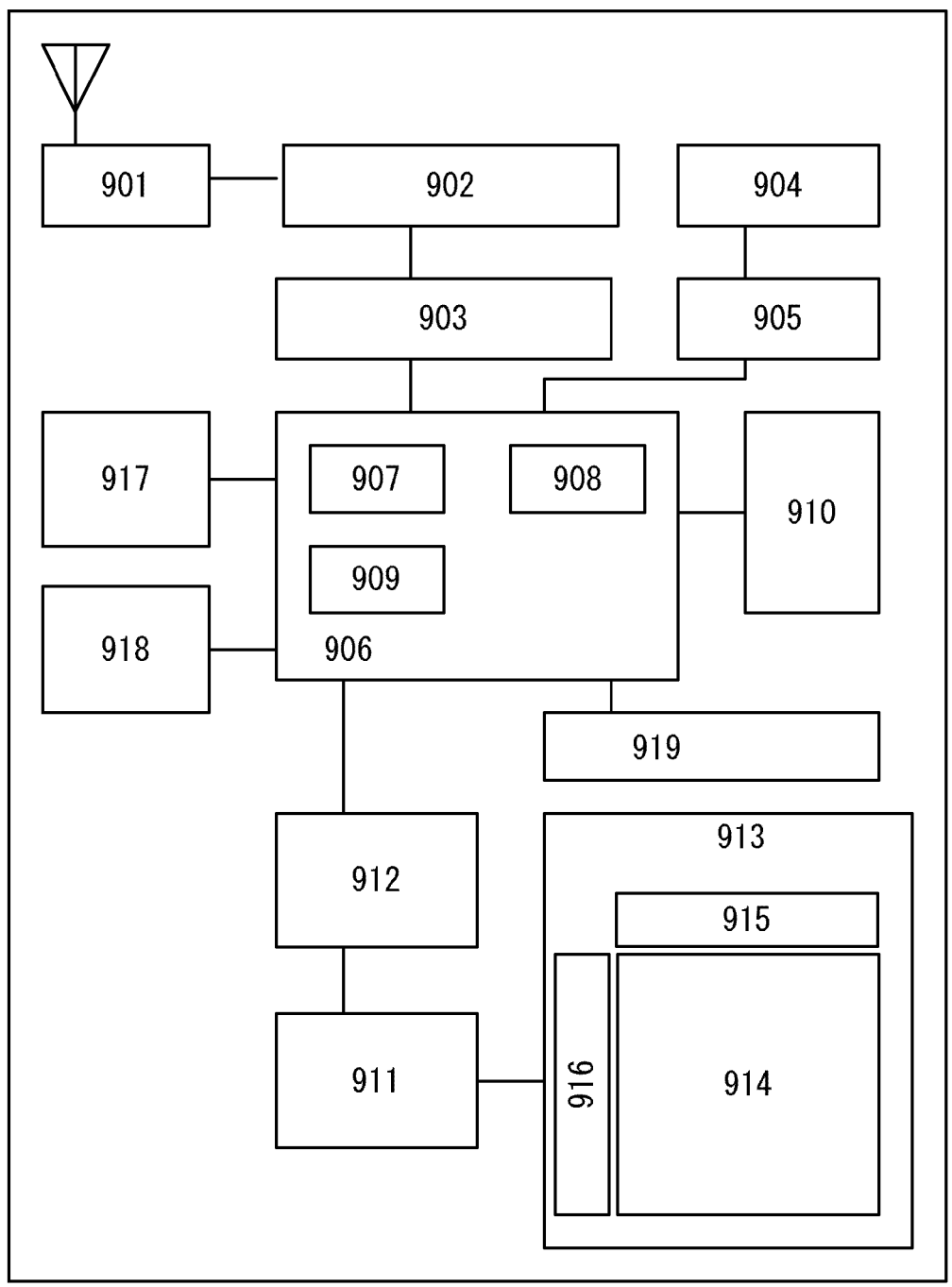
FIG. 14 is a block diagram illustrating one embodiment of a semiconductor device.

Next, a block diagram of a portable device is illustrated in FIG. 14. The portable device illustrated in FIG. 14 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a central processing unit (CPU) 907, a DSP 908, and an interface (IF) 909. In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced. Further, the power consumption of the CPU 907 can be sufficiently reduced by employing the semiconductor device described in any of the above embodiments for a main memory device for storing data or an instruction or a buffer memory device capable of high-speed writing and reading of data, such as a register or a cache, which is included in the CPU 907.

Figure 15:
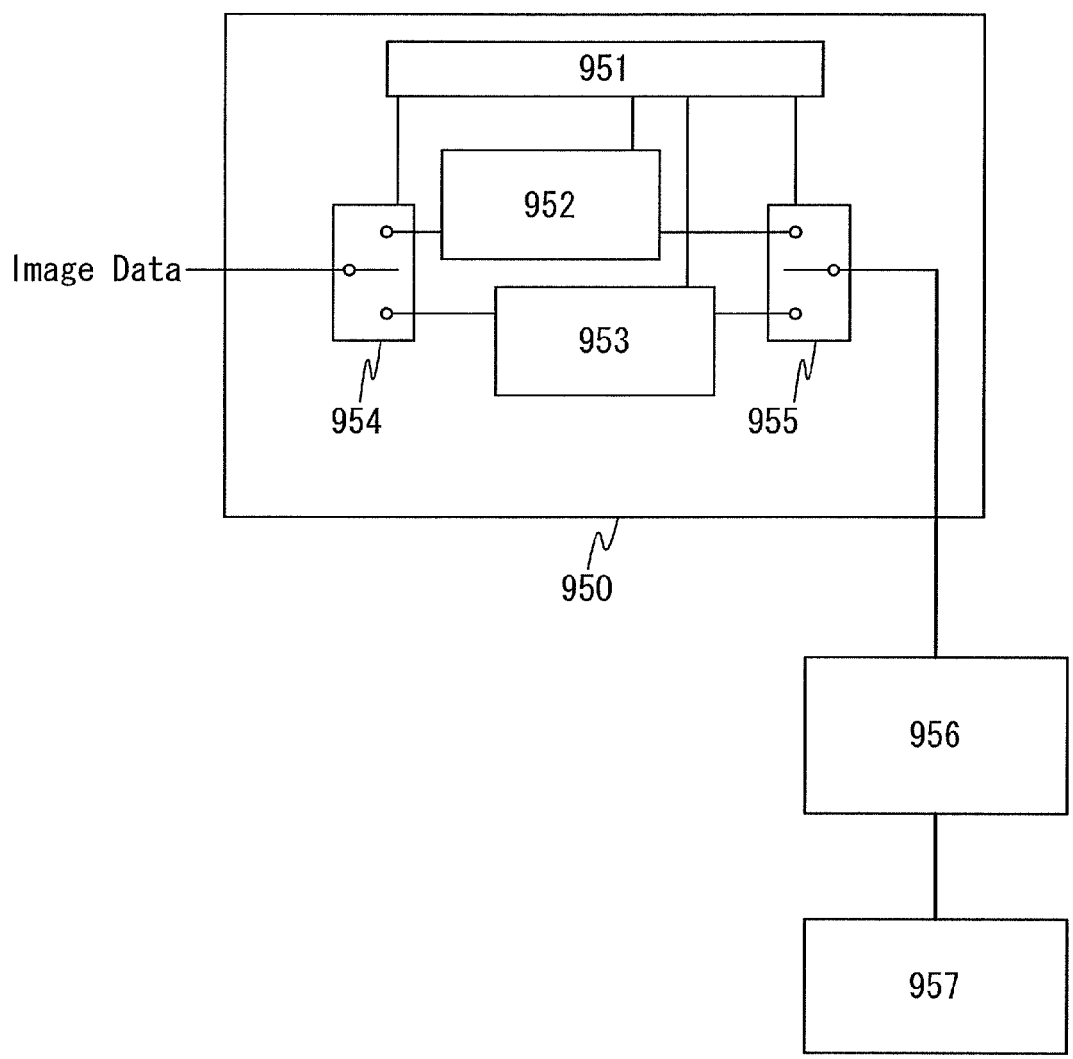
FIG. 15 is a block diagram illustrating one embodiment of a semiconductor device.

FIG. 15 illustrates an example of using the semiconductor device described in any of the above embodiments in a memory circuit 950 for a display. The memory circuit 950 illustrated in FIG. 15 includes a memory 952, a memory 953, a switch 954, a switch 955, and a memory controller 951. Furthermore, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is held in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 with a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 16:
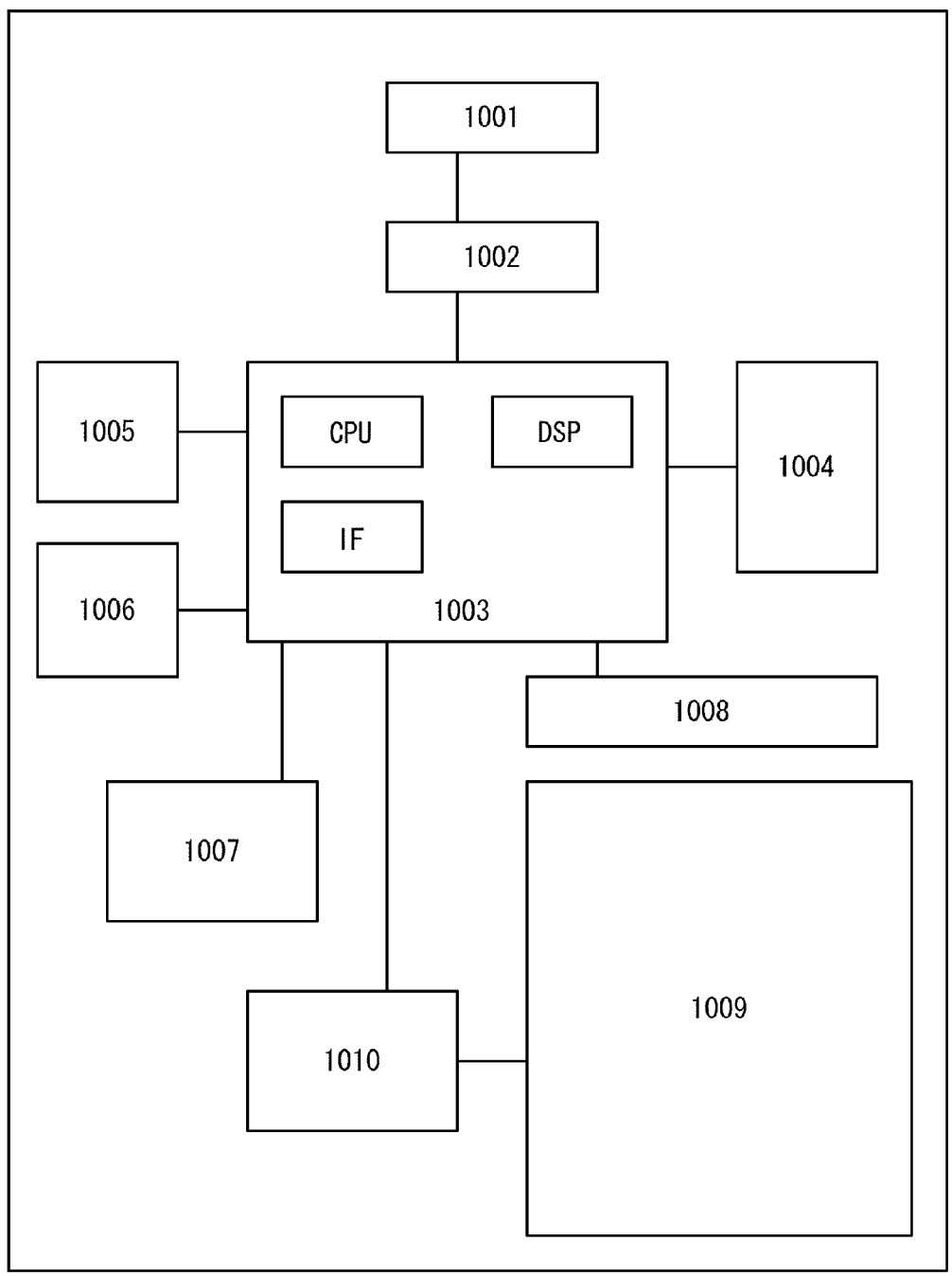
FIG. 16 is a block diagram illustrating one embodiment of a semiconductor device.

Next, a block diagram of an e-book reader is illustrated in FIG. 16. The e-book reader in FIG. 16 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 16. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding data of a place specified by users. In order to save data for a long time, the data may be copied into the flash memory 1004. Even in such a case, by employing the semiconductor device described in any of the above embodiments, writing and reading of data can be performed at high speed, stored data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced can be obtained.

Note that the structures, methods, and the like described in this embodiment can be used as appropriate in combination with any of the structures, methods, and the like described in the other embodiments.

Example 1

In this example, defects generated at the time when a silicon oxynitride film is formed by a CVD method and the film density of the silicon oxynitride film will be described.

First, defects generated at the time when a silicon oxynitride film is formed will be described. Specifically, the results of ESR measurement conducted on samples in each of which a silicon oxynitride film is formed over a quartz substrate are used for description.

First, samples which were manufactured are described. Each of the samples which were manufactured has a structure in which a 200 nm-thick silicon oxynitride film is formed over a quartz substrate.

The silicon oxynitride film was formed under the following conditions: the quartz substrate was placed in a process chamber of a plasma CVD apparatus, a source gas in which the flow rate of silane is 100 sccm and the flow rate of dinitrogen monoxide is 3000 sccm was supplied to the process chamber, the pressure in the process chamber was controlled to be 40 Pa, and high-frequency power was supplied at a frequency of 27.12 MHz. The substrate temperature was set to 350° C. Note that the plasma CVD apparatus indicates a parallel plate plasma CVD apparatus with an electrode area of 6000 cm$^2$. There were three conditions of the supplied power (power density). The sample formed with a power of 300 W (0.05 W/cm$^2$) is Comparative Sample 1, the sample formed with a power of 1000 W (0.17 W/cm$^2$) is Sample 1, and the sample formed with a power of 1500 W (0.26 W/cm$^2$) is Sample 2.

Next, ESR measurement was performed on Sample 1, Sample 2, and Comparative Sample 1. The ESR measurement was performed under the following conditions. The measurement temperature was room temperature (25° C.), a high-frequency power (power of microwaves) of 9.2 GHz was 20 mW, and the direction of a magnetic field was parallel to a surface of each of the silicon oxynitride films in Sample 1, Sample 2, and Comparative Sample 1. The lower limit of the detection of the spin density of a signal at g=2.001, which is due to dangling bonds of silicon contained in the silicon oxynitride film, was $1.0 \times 10^{15}$ spins/cm$^2$.

Figure 17A:
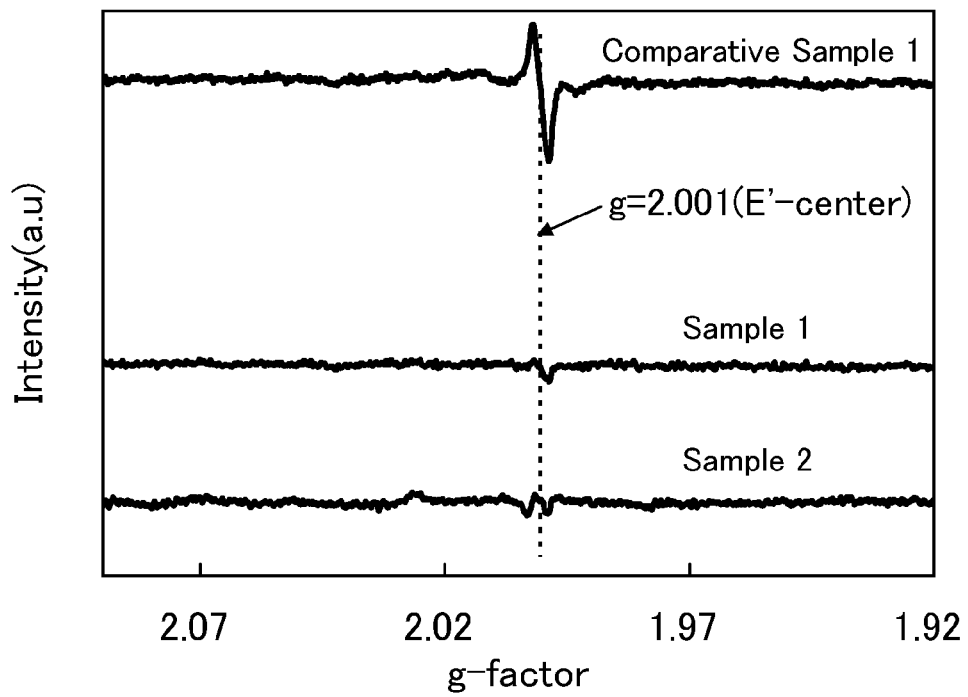
FIGS. 17A and 17B are graphs showing spin densities of samples.
Figure 17B:
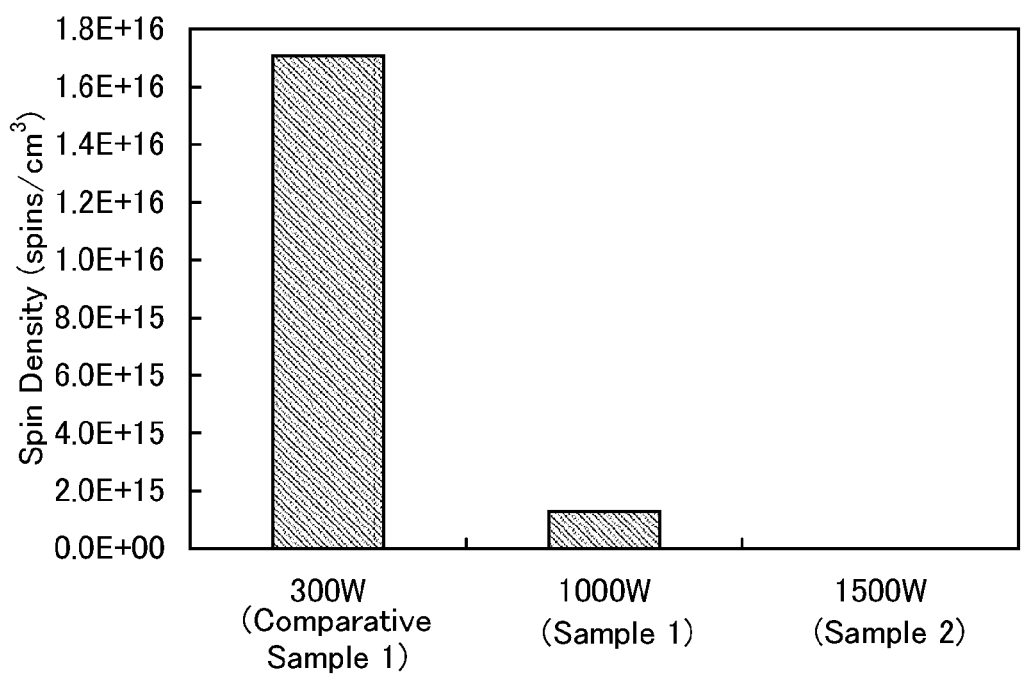

Results of the ESR measurement are shown in FIGS. 17A and 17B. FIG. 17A shows first derivative curves of the silicon oxynitride films in Sample 1, Sample 2, and Comparative Sample 1. FIG. 17A shows that Sample 1 and Sample 2 have lower signal intensity than Comparative Sample 1 at a g value of 2.001.

FIG. 17B is a graph showing a relation between power supplied for the formation of the silicon oxynitride film and spin density of a signal with a g value of 2.001 of the silicon oxynitride film. The lower the spin density is, the fewer the defects that are dangling bonds of silicon contained in the silicon oxynitride film become. When the supplied power is 1000 W, the spin density of a signal with a g value of 2.001 of Sample 1 is $1.3 \times 10^{15}$ spins/cm$^3$. When the supplied power is 1500 W, the spin density of a signal with a g value of 2.001 of Sample 2 is below the lower limit of detection. The spin density of a signal with a g value of 2.001 of Comparative Sample 1 is $1.7 \times 10^{16}$ spins/cm$^3$.

According to FIGS. 17A and 17B, as the power supplied for the formation of the silicon oxynitride film is increased, the spin density tends to be decreased.

Next, the film density of the silicon oxynitride film will be described. Specifically, XRR (X-ray reflectometry) results of Sample 1, Sample 2, and Comparative Sample 1 will be described.

Figure 18:
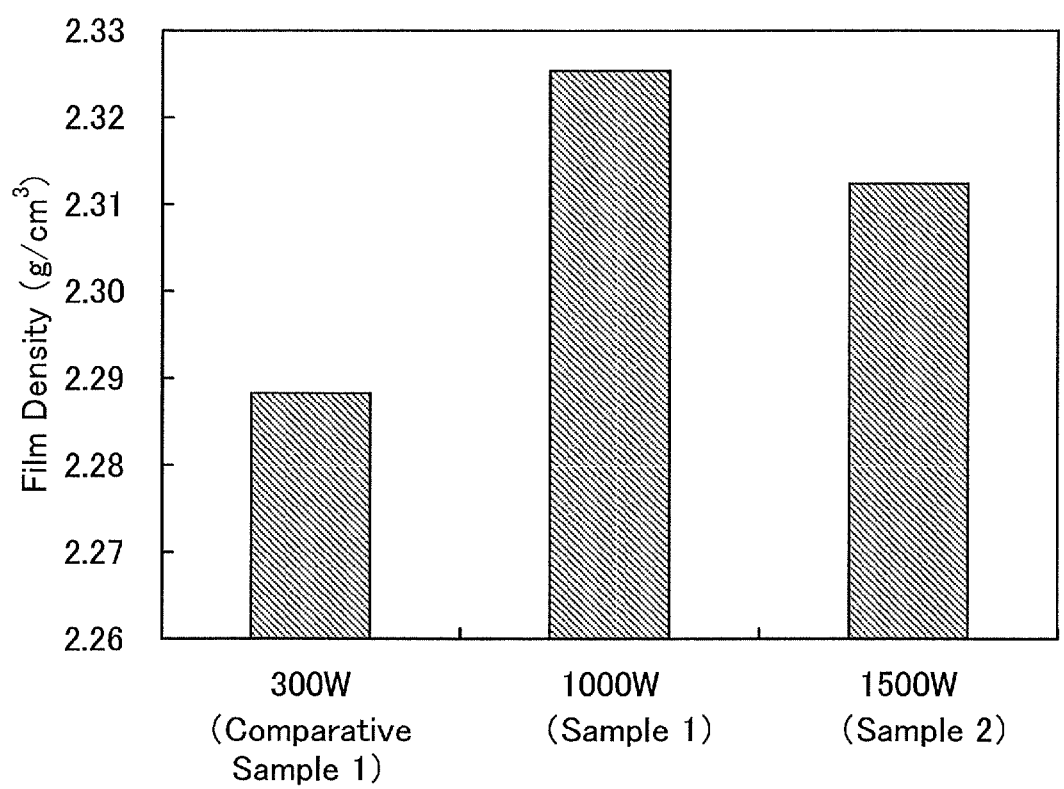
FIG. 18 is a graph showing film densities of samples.

FIG. 18 shows the results of measuring the film densities of Sample 1, Sample 2, and Comparative Sample 1. FIG. 18 is a graph showing a relation between power supplied for the formation of the silicon oxynitride film and film density of the silicon oxynitride film.

When the supplied power is 1000 W, the film density of Sample 1 is 2.33 g/cm$^3$. When the supplied power is 1500 W, the film density of Sample 2 is 2.31 g/cm$^3$. When the supplied power is 300 W, the film density of Comparative Sample 1 is 2.29 g/cm$^3$.

FIG. 18 shows that, when the power supplied for the formation of the silicon oxynitride film is 1000 W or more, the film density is likely to be increased.

Here, the hydrogen concentration and the nitrogen concentration in the silicon oxynitride film of Sample 1 are shown in Table 1.

TABLE 1

| H concentration [atoms/cm$^3$] | N concentration [atoms/cm$^3$] |
|---|---|
| 8.57E+20 | 3.92E+20 |

From the above, a silicon oxide film or a silicon oxynitride film with high film density and few defects that are dangling bonds of silicon, typically a silicon oxynitride film whose film density is higher than or equal to 2.26 g/cm$^3$ and lower than or equal to 2.63 g/cm$^3$ and whose spin density of a signal with a g value of 2.001 is 2×10$^{15}$ spins/cm$^3$ or less in ESR can be formed under the following conditions: a substrate placed in a process chamber which is evacuated to a vacuum level in a plasma CVD apparatus is held at a temperature higher than or equal to 300° C. and lower than or equal to 400° C., preferably higher than or equal to 320° C. and lower than or equal to 380° C.; the pressure in the process chamber is set higher than or equal to 30 Pa and lower than or equal to 250 Pa, preferably higher than or equal to 40 Pa and lower than or equal to 200 Pa by introducing a source gas to the process chamber; and high-frequency power was supplied at a frequency higher than or equal to 0.17 W/cm$^2$ and lower than or equal to 0.5 W/cm$^2$, preferably higher than or equal to 0.26 W/cm$^2$ and lower than or equal to 0.35 W/cm$^2$. In a transistor including an oxide semiconductor film, such a silicon oxynitride film is provided as an insulating film in contact with the oxide semiconductor film, whereby the transistor can have excellent electric characteristics.

Example 2

In this example, results of a gate BT test with light irradiation of a semiconductor device according to one embodiment of the present invention will be described. Specifically, a shift in the threshold voltage of the transistor according to one embodiment of the present invention will be described.

First, steps of forming the transistor are described. In this example, the steps are described with reference to FIGS. 2A to 2D.

First, a glass substrate was prepared as the substrate 11, and the substrate 11 was subjected to heat treatment. The heat treatment was performed at 480° C. for an hour in an atmosphere containing nitrogen. Next, the base insulating film 13 was formed over the substrate 11.

As the base insulating film 13, a 100 nm-thick silicon nitride film and a 150 nm-thick silicon oxynitride film were stacked.

Next, the gate electrode 15 was formed over the base insulating film 13.

A 100 nm-thick tungsten film was formed by a sputtering method, a mask was formed over the tungsten film by a photolithography step, and part of the tungsten film was etched with the use of the mask, so that the gate electrode 15 was formed.

Then, over the gate electrode 15, the gate insulating film 17 in which a 50 nm-thick silicon nitride film and a 200 nm-thick silicon oxide film were stacked was formed.

The silicon nitride film was formed in the following manner: silane and nitrogen were supplied at 50 sccm and 5000 sccm, respectively, into a process chamber of a plasma CVD apparatus; the pressure of the process chamber was adjusted to 60 Pa; and a power of 1500 W was supplied with a high-frequency power supply of 27.12 MHz. The silicon oxynitride film was formed in the following manner: silane and dinitrogen monoxide were supplied at 100 sccm and 3000 sccm, respectively, into the process chamber of the plasma CVD apparatus; the pressure of the process chamber was adjusted to 40 Pa; and a power of 1500 W was supplied with a high-frequency power supply of 27.12 MHz. Note that each of the silicon nitride film and the silicon oxynitride film was formed at a substrate temperature of 350° C. Note that the silicon oxynitride film was formed under the deposition conditions for the gate insulating film 17 in the transistor 10 in Embodiment 1.

Next, the oxide semiconductor film 18 was formed to overlap with the gate electrode 15 with the gate insulating film 17 interposed therebetween.

As the oxide semiconductor film 18, a 35 nm-thick IGZO film that was a CAAC-OS film was formed by a sputtering method. The IGZO film was formed in such a manner that a sputtering target where In:Ga:Zn=1:1:1 (atomic ratio) was used, argon and oxygen were supplied as a sputtering gas into a process chamber of a sputtering apparatus at a flow rate of 50 sccm for each, and film formation was performed at a DC power of 5 kW with the pressure in the process chamber adjusted to 0.6 Pa. Note that the IGZO film was formed at a substrate temperature of 170° C.

For the structure obtained through the steps up to here, FIG. 2A can be referred to.

Next, a mask was formed over the IGZO film by a photolithography step, and part of the IGZO film was etched with the use of the mask. Then, the etched IGZO film was subjected to heat treatment, so that the oxide semiconductor film 19 was formed.

Next, heat treatment was performed. Here, first treatment was performed in a nitrogen atmosphere, and then second heat treatment was performed in an oxygen atmosphere. The temperature of each of the first heat treatment and the second heat treatment was 450° C., and treatment time for each of the first heat treatment and the second heat treatment was 1 hour.

For the structure obtained through the steps up to here, FIG. 2B can be referred to.

Next, the pair of electrodes 21 in contact with the oxide semiconductor film 19 was formed.

A conductive film was formed over the gate insulating film 17 and the oxide semiconductor film 19, a mask was formed over the conductive film by a photolithography step, and part of the conductive film was etched with the use of the mask, so that the pair of electrodes 21 was formed. Note that the conductive film had a stacked structure in which a 400 nm-thick aluminum film was formed over the 100 nm-thick titanium film and a 100 nm-thick titanium film was formed over the aluminum film.

For the structure obtained through the steps up to here, FIG. 2C can be referred to.

Next, heat treatment was performed. The heat treatment was performed at a temperature of 300° C. in an atmosphere containing nitrogen for 1 hour.

Next, the insulating film 23 was formed over the gate insulating film 17, the oxide semiconductor film 19, and the pair of electrodes 21.

For the structure obtained through the steps up to here, FIG. 2D can be referred to.

After the insulating film 23 was formed, the structure obtained through the steps up to here was subjected to heat treatment. The heat treatment includes first heat treatment in a nitrogen atmosphere and second heat treatment in an oxygen atmosphere, which follows the first heat treatment. The temperature of each of the first heat treatment and the second heat treatment was 300° C., and treatment time for each of the first heat treatment and the second heat treatment was 1 hour.

Next, a 1.5 μm-thick acrylic layer was formed over the insulating film 23. Then, the acrylic layer was partly etched so that the pair of electrodes was exposed. After that, a pixel electrode connected to the pair of electrodes was formed. Here, as the pixel electrode, ITO was deposited with a thickness of 100 nm by a sputtering method.

Through the above steps, a transistor which is one embodiment of the present invention was formed. Note that the transistor formed through the above steps is Sample X.

Here, steps of forming a transistor as a comparative example are described. The transistor which is a comparative example (hereinafter, referred to as Sample Y) is a transistor in which the gate insulating film 17 is formed by a step described below, and the other steps are the same as those of forming Sample X. As in Sample X, the gate insulating film 17 in Sample Y has a stacked structure of a silicon nitride film and a silicon oxynitride film. The silicon oxynitride film was formed under conditions described below. Note that the deposition conditions of the silicon nitride film in Sample Y are the same as those of the silicon nitride film in Sample X.

The silicon oxynitride film of Sample Y was formed in the following manner: silane and nitrogen were supplied at 100 sccm and 3000 sccm, respectively, to a process chamber of a plasma CVD apparatus; the pressure in the process chamber was adjusted to 40 Pa; and a power of 300 W was supplied with a high-frequency power supply of 27.12 MHz. Note that each of the silicon nitride film and the silicon oxynitride film was formed at a substrate temperature of 350° C. Note that the silicon oxynitride film was formed under deposition conditions which are different from those for the gate insulating film 17 of the transistor 10 in Embodiment 1.

Next, Sample X and Sample Y were subjected to a gate BT test with light irradiation. Here, a negative gate BT test with light irradiaiton was performed under the following conditions: the substrate temperature was 80° C.; the intensity of an electric field applied to the gate insulating film was 1.2 MV/cm; the application time was 2000 seconds; a white LED emitting white light with 3000 lx was used; and a negative voltage was applied to the gate electrode.

A method of the negative gate BT test with light irradiation and a measuring method of Vg-Id characteristics of the transistor are described. In order to measure initial characteristics of a transistor subjected to the negative gate BT test, a change in characteristics of current between a source electrode and a drain electrode (hereinafter, referred to as drain current) was measured, under the conditions where the substrate temperature was set to 25° C., the voltage between the source electrode and the drain electrode (hereinafter, referred to as drain voltage) was set to 1V and 10 V, and the voltage between the source electrode and the gate electrode (hereinafter, referred to as gate voltage) was changed in the range of −30 V to +30 V. That is, Vg-Id characteristics were measured.

Next, the substrate temperature was increased to 80° C., and then, the potentials of the source electrode and the drain electrode of the transistor were set to 0 V. Then, voltage was applied to the gate electrode so that the intensity of the electric field applied to the gate insulating film was 1.2 MV/cm. In this example, since the thickness of the gate insulating film of the transistor was 250 nm, the gate electrode was supplied with −30 V and was kept for 2000 seconds.

Next, the substrate temperature was decreased to 25° C. while a voltage was applied to the gate electrode and the source and drain electrodes. After the substrate temperature was decreased to 25° C., the application of voltage to the gate electrode and the source and drain electrodes was stopped.

Then, Vg-Id characteristics were measured under the conditions which are the same as those for the measurement of the initial characteristics, and Vg-Id characteristics after the negative gate BT test with light irradiation were obtained.

Figure 19:
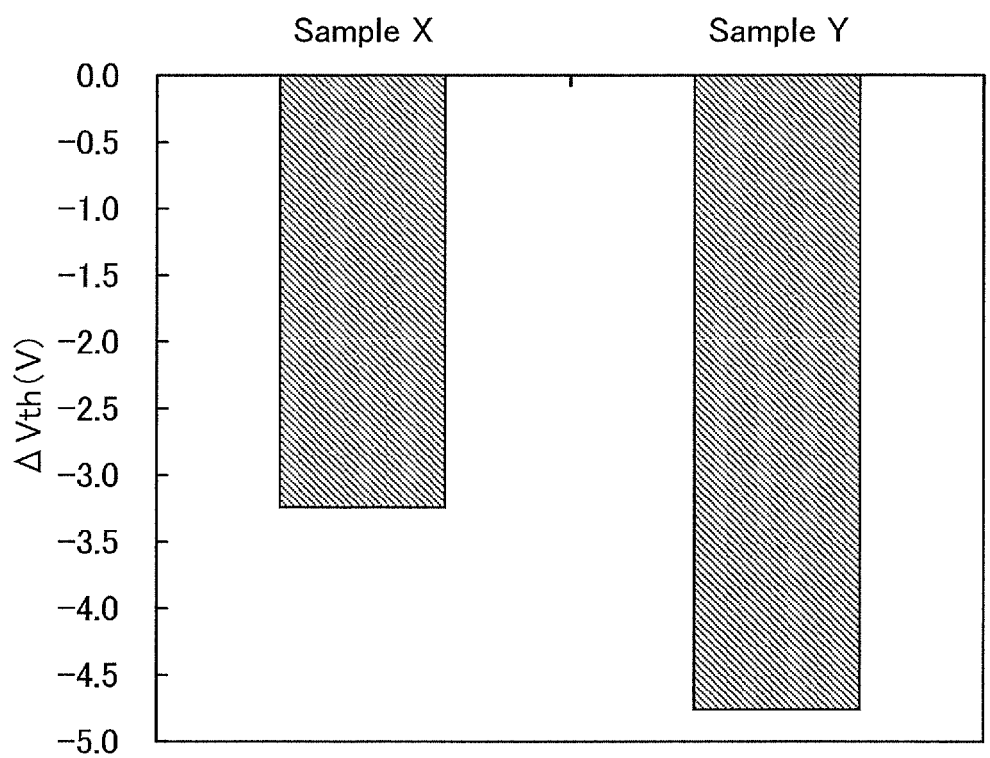
FIG. 19 is a graph showing changes in threshold voltages of transistors.

A difference (ΔVth) between the threshold voltage of the initial characteristics and the threshold voltage after the negative gate BT test with light irradiation is shown in FIG. 19. The vertical axis represents ΔVth. The threshold voltage of Sample Y is largely changed compared to that of Sample X. From the above, with the use of a gate insulating film with high film density and few dangling bonds of silicon as a gate insulating film of a transistor, a shift in the threshold voltage due to a negative gate BT test with light irradiation is small.

EXPLANATION OF REFERENCE

10: transistor, 11: substrate, 13: base insulating film, 15: gate electrode, 17: gate insulating film, 18: oxide semiconductor film, 19: oxide semiconductor film, 20: oxide semiconductor film, 21: electrode, 22: oxygen, 23: insulating film, 30: transistor, 31: insulating film, 32: insulating film, 33: gate insulating film, 34: insulating film, 35: oxygen, 36: insulating film, 37: protective film, 100: transistor, 101: substrate, 103: base insulating film, 105: oxide semiconductor film, 107: electrode, 109: gate insulating film, 110: opening, 111: gate electrode, 113: insulating film, 115: wiring, 120: transistor, 121: oxide semiconductor film, 123: region, 125: region, 127: region, 129: gate electrode, 130: transistor, 131: oxide semiconductor film, 133: region, 135: region, 137: region, 139: electrode, 191: substrate, 210: transistor, 211: oxide semiconductor film, 213: region, 215: region, 217: insulating film, 219: wiring, 220: transistor, 221: sidewall insulating film, 223: gate insulating film, 225: electrode, 230: transistor, 231: gate electrode, 233: insulating film, 0601: JISB, 701: substrate, 702: STI, 704a: transistor, 704b: transistor, 704c: transistor, 705: impurity region, 706: gate insulating film, 707: gate electrode, 708: gate electrode, 709: insulating film, 710: sidewall insulating film, 711: insulating film, 712: insulating film, 713: insulating film, 714a: contact plug, 714b: contact plug, 715: insulating film, 716: insulating film, 717: barrier film, 718: wiring, 719: barrier film, 720: insulating film, 721: insulating film, 722: barrier film, 723: wiring, 724: barrier film, 725a: insulating film, 725b: insulating film, 726: gate insulating film, 727: insulating film, 728: insulating film, 729: insulating film, 730a: contact plug, 730b: contact plug, 731: insulating film, 732: insulating film, 733: barrier film, 734a: wiring, 734b: wiring, 735: barrier film, 740: protective film, 750: transistor, 751: gate electrode, 761: transistor, 762: transistor, 763: transistor, 764: transistor, 771: transistor, 772: transistor, 773: transistor, 774: transistor, 801: transistor, 803: transistor, 804: transistor, 805: transistor, 806: transistor, 807: X decoder, 808: Y decoder, 811: transistor, 812: storage capacitor, 813: X decoder, 814: Y decoder, 901: RF circuit, 902: analog baseband circuit, 903: digital baseband circuit, 904: battery, 905: power supply circuit, 906: application processor, 907: CPU, 908: DSP, 910: flash memory, 911: display controller, 912: memory circuit, 913: display, 914: display portion, 915: source driver, 916: gate driver, 917: audio circuit, 918: keyboard, 919: touch sensor, 950: memory circuit, 951: memory controller, 952: memory, 953: memory, 954: switch, 955: switch, 956: display controller, 957: display, 1001: battery, 1002: power supply circuit, 1003: microprocessor, 1004: flash memory, 1005: audio circuit, 1006: keyboard, 1007: memory circuit, 1008: touch panel, 1009: display, and 1010: display controller This application is based on Japanese Patent Application serial no. 2012-092323 filed with Japan Patent Office on Apr. 13, 2012 and Japanese Patent Application serial no. 2013-051819 filed with Japan Patent Office on Mar. 14, 2013, the entire contents of which are hereby incorporated by reference.

The invention claimed is:

1. A semiconductor device comprising:
a gate electrode;
an oxide semiconductor film;
a gate insulating film between the gate electrode and the oxide semiconductor film; and
a pair of electrodes electrically connected to the oxide semiconductor film,
wherein a film density of the gate insulating film is higher than or equal to 2.26 g/cm$^3$ and lower than or equal to 2.63 g/cm$^3$, and
wherein, in the gate insulating film, a spin density of a signal with a g value of 2.001 is $2 \times 10^{15}$ spins/cm$^3$ or less in electron spin resonance.

2. The semiconductor device according to claim 1,
wherein the gate insulating film comprises silicon oxide or silicon oxynitride.

3. The semiconductor device according to claim 1 further comprising an insulating film between the gate electrode and the gate insulating film.

4. A semiconductor device comprising:
a gate electrode;
a gate insulating film over the gate electrode;
an oxide semiconductor film over the gate insulating film; and
a first insulating film over the oxide semiconductor film,
wherein a film density of the gate insulating film is higher than or equal to 2.26 g/cm$^3$ and lower than or equal to 2.63 g/cm$^3$,
wherein, in the gate insulating film, a spin density of a signal with a g value of 2.001 is $2 \times 10^{15}$ spins/cm$^3$ or less in electron spin resonance,
wherein a film density of the first insulating film is higher than or equal to 2.26 g/cm$^3$ and lower than or equal to 2.63 g/cm$^3$, and
wherein, in the first insulating film, a spin density of a signal with a g value of 2.001 is $2 \times 10^{15}$ spins/cm$^3$ or less in electron spin resonance.

5. The semiconductor device according to claim 4,
wherein the gate insulating film comprises silicon oxide or silicon oxynitride.

6. The semiconductor device according to claim 4,
wherein the first insulating film comprises silicon oxide or silicon oxynitride.

7. The semiconductor device according to claim 4 further comprising a second insulating film between the gate electrode and the gate insulating film.

8. The semiconductor device according to claim 4 further comprising a second insulating film over the first insulating film.

9. A semiconductor device comprising:
an insulating film;
an oxide semiconductor film over the insulating film;
a gate insulating film over the oxide semiconductor film; and
a gate electrode,
wherein a film density of the gate insulating film is higher than or equal to 2.26 g/cm$^3$ and lower than or equal to 2.63 g/cm$^3$,
wherein, in the gate insulating film, a spin density of a signal with a g value of 2.001 is $2 \times 10^{15}$ spins/cm$^3$ or less in electron spin resonance,
wherein a film density of the insulating film is higher than or equal to 2.26 g/cm$^3$ and lower than or equal to 2.63 g/cm$^3$, and
wherein, in the insulating film, a spin density of a signal with a g value of 2.001 is $2 \times 10^{15}$ spins/cm$^3$ or less in electron spin resonance.

10. The semiconductor device according to claim 9,
wherein the gate insulating film comprises silicon oxide or silicon oxynitride.

11. The semiconductor device according to claim 9,
wherein the insulating film comprises silicon oxide or silicon oxynitride.

12. The semiconductor device according to claim 9 further comprising a pair of electrodes electrically connected to the oxide semiconductor film,
wherein the pair of electrodes overlaps with the gate electrode.

13. The semiconductor device according to claim 4,
wherein one surface of the oxide semiconductor film is in contact with the gate insulating film, and
wherein another surface of the oxide semiconductor film is in contact with the first insulating film.

14. The semiconductor device according to claim 4 further comprising a pair of electrodes electrically connected to the oxide semiconductor film.

15. The semiconductor device according to claim 9 further comprising a pair of electrodes electrically connected to the oxide semiconductor film.

* * * * *

UNITED STATES PATENT AND TRADEMARK OFFICE
CERTIFICATE OF CORRECTION

| | | |
|---|---|---|
| PATENT NO. | : 9,054,200 B2 | Page 1 of 1 |
| APPLICATION NO. | : 13/856452 | |
| DATED | : June 9, 2015 | |
| INVENTOR(S) | : Kenichi Okazaki et al. | |

It is certified that error appears in the above-identified patent and that said Letters Patent is hereby corrected as shown below:

Specification

At column 7, line 49, "100 nm" should be --100 nm.--;

At column 8, line 64, "In $\geq$ Ga." should be --In $\leq$ Ga.--;

At column 9, line 10, "In $\geq$ Ga" should be --In $\leq$ Ga--.

Signed and Sealed this
Fifteenth Day of December, 2015

Michelle K. Lee
*Director of the United States Patent and Trademark Office*